US006983191B2

(12) United States Patent
Mikata

(10) Patent No.: US 6,983,191 B2
(45) Date of Patent: Jan. 3, 2006

(54) SEMICONDUCTOR MANUFACTURING LINE AVAILABILITY EVALUATING SYSTEM AND DESIGN SYSTEM

(75) Inventor: Yuuichi Mikata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/948,166

(22) Filed: Sep. 24, 2004

(65) Prior Publication Data

US 2005/0107904 A1 May 19, 2005

(30) Foreign Application Priority Data

Sep. 26, 2003 (JP) .............................. 2003-336248

(51) Int. Cl.
*G06F 19/00* (2006.01)
(52) U.S. Cl. .................... 700/121; 700/97; 438/775
(58) Field of Classification Search ............... 700/121, 700/97, 104, 99, 208; 438/775, 791, 14; 257/640, 301, 411, 649
See application file for complete search history.

(56) References Cited

U.S. PATENT DOCUMENTS 6,671,570 B2 * 12/2003 Schulze ..................... 700/121
6,801,819 B1 * 10/2004 Barto et al. ................. 700/99
2004/0243266 A1 * 12/2004 Mata et al. .................. 700/99

OTHER PUBLICATIONS

Y. Mikata et al.; "Improvement of Mini Fab Uptime by the Multi-Task and Multi-Functional Tools"; ISSM 2003 Conference Proceedings, Int'l. Symposium on Semiconductor Manufacturing, pp. 73-76, (2003).

* cited by examiner

*Primary Examiner*—Kidest Bahta
(74) *Attorney, Agent, or Firm*—Finnegan, Henderson, Farabow, Garrett & Dunner, L.L.P.

(57) ABSTRACT

An availability evaluation system of a semiconductor manufacturing line, comprising a unit configured to calculate an incidence probability Xi (i=1 to k) in combination by applying a tool operation probability and a tool stoppage probability to all combinations "k" in which at least a line fabrication availability is not zero, of the combinations of operation and stoppage of tools, and by obtaining a product of the probabilities of all the tools, and a unit configured to, when a product between the incidence probability Xi of a combination and a fabrication availability Yi of the combination is defined as a probability converted fabrication availability with respect to each of the combinations, calculate an availability value of $Q = \Sigma_{(i=1 \, to \, k)} X1 \times Y1 / F$ obtained by dividing a sum of probability converted fabrication availabilities of the combinations by a fabrication availability F at a 100% availability.

19 Claims, 26 Drawing Sheets

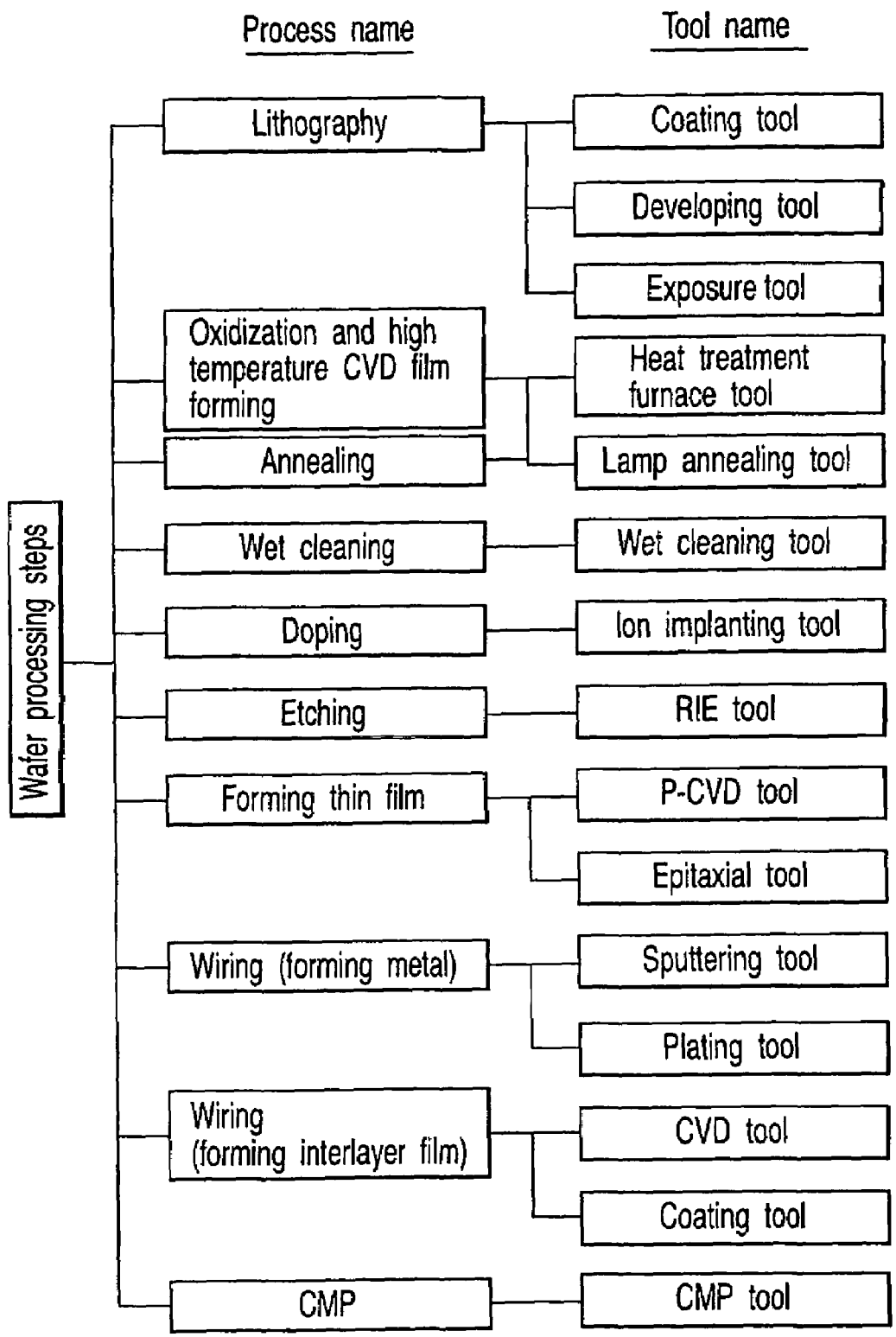
F I G. 1

| Classification | Type | | |
|---|---|---|---|
| | One-tool unit group A | Two-tool unit group B | Three-tool unit group C |
| LITHO | 0 | 1 | 1 |
| WET | 12 | 2 | 0 |
| DIFF | 5 | 0 | 0 |
| RTP | 2 | 0 | 0 |
| LPCVD | 4 | 0 | 0 |
| PECVD | 3 | 0 | 0 |
| METAL | 2 | 2 | 0 |
| RIE | 7 | 0 | 0 |
| ASHER | 1 | 1 | 0 |
| IMPLA | 3 | 0 | 0 |
| CMP | 2 | 2 | 1 |
| Number of tool units | 41 | 8 | 2 |
| Subtotal number of tools | 41 | 16 | 6 |
| Total number of tools | 63 | | |
F I G. 2
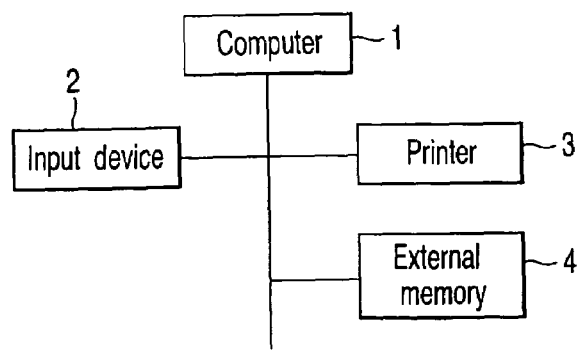
F I G. 5 B

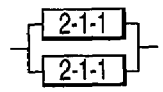

FIG. 9A

| Two-tool unit group 1 | | | |
|---|---|---|---|
| | 2-1-1 | 2-1-2 | |
| Case1 | ○ | ○ | pp |
| Case2 | × | ○ | (1−p)p |
| Case3 | ○ | × | p(1−p) |

FIG. 9B

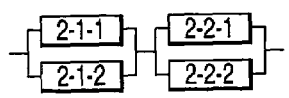

FIG. 9C

| Two-tool unit group 2 | | | | |
|---|---|---|---|---|
| | 2-1-1 | 2-1-2 | 2-2-1 | 2-2-2 |
| Case1 | ○ | ○ | ○ | ○ | pppp
| Case2 | × | ○ | ○ | ○ | (1−p)ppp
| Case3 | ○ | × | ○ | ○ | p(1−p)pp
| Case4 | ○ | ○ | × | ○ | pp(1−p)p
| Case5 | × | ○ | × | ○ | (1−p)p(1−p)p
| Case6 | ○ | × | × | ○ | p(1−p)(1−p)p
| Case7 | ○ | ○ | ○ | × | ppp(1−p)
| Case8 | × | ○ | ○ | × | (1−p)pp(1−p)
| Case9 | ○ | × | ○ | × | p(1−p)p(1−p)

FIG. 9D

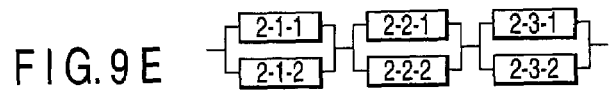

FIG. 9E

| Two-tool unit group 3 | | | | | | |
|---|---|---|---|---|---|---|
| | 2-1-1 | 2-1-2 | 2-2-1 | 2-2-2 | 2-3-1 | 2-3-2 |
| Case1 | ○ | ○ | ○ | ○ | ○ | ○ | pppppp
| Case2 | × | ○ | ○ | ○ | ○ | ○ | (1−p)ppppp
| Case3 | ○ | × | ○ | ○ | ○ | ○ | p(1−p)pppp
| Case4 | ○ | ○ | × | ○ | ○ | ○ | pp(1−p)ppp
| Case5 | × | ○ | × | ○ | ○ | ○ | (1−p)p(1−p)ppp
| Case6 | ○ | × | × | ○ | ○ | ○ | p(1−p)(1−p)ppp
| Case7 | ○ | ○ | ○ | × | ○ | ○ | ppp(1−p)pp
| Case8 | × | ○ | ○ | × | ○ | ○ | (1−p)pp(1−p)pp
| Case9 | ○ | × | ○ | × | ○ | ○ | p(1−p)p(1−p)pp
| Case10 | ○ | ○ | ○ | ○ | × | ○ | pppp(1−p)p
| Case11 | × | ○ | ○ | ○ | × | ○ | (1−p)ppp(1−p)p
| Case12 | ○ | × | ○ | ○ | × | ○ | p(1−p)pp(1−p)p
| Case13 | ○ | ○ | × | ○ | × | ○ | pp(1−p)p(1−p)p
| Case14 | × | ○ | × | ○ | × | ○ | (1−p)p(1−p)p(1−p)p
| Case15 | ○ | × | × | ○ | × | ○ | p(1−p)(1−p)p(1−p)p
| Case16 | ○ | ○ | ○ | × | × | ○ | ppp(1−p)(1−p)p
| Case17 | × | ○ | ○ | × | × | ○ | (1−p)pp(1−p)(1−p)p
| Case18 | ○ | × | ○ | × | × | ○ | p(1−p)p(1−p)(1−p)p
| Case19 | ○ | ○ | ○ | ○ | ○ | × | ppppp(1−p)
| Case20 | × | ○ | ○ | ○ | ○ | × | (1−p)pppp(1−p)
| Case21 | ○ | × | ○ | ○ | ○ | × | p(1−p)ppp(1−p)
| Case22 | ○ | ○ | × | ○ | ○ | × | pp(1−p)pp(1−p)
| Case23 | × | ○ | × | ○ | ○ | × | (1−p)p(1−p)pp(1−p)
| Case24 | ○ | × | × | ○ | ○ | × | p(1−p)(1−p)pp(1−p)
| Case25 | ○ | ○ | ○ | × | ○ | × | ppp(1−p)p(1−p)
| Case26 | × | ○ | ○ | × | ○ | × | (1−p)pp(1−p)p(1−p)
| Case7 | ○ | × | ○ | × | ○ | × | p(1−p)p(1−p)p(1−p)

FIG. 9F

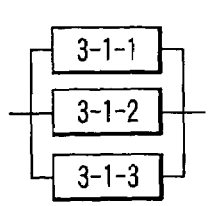
FIG. 10A
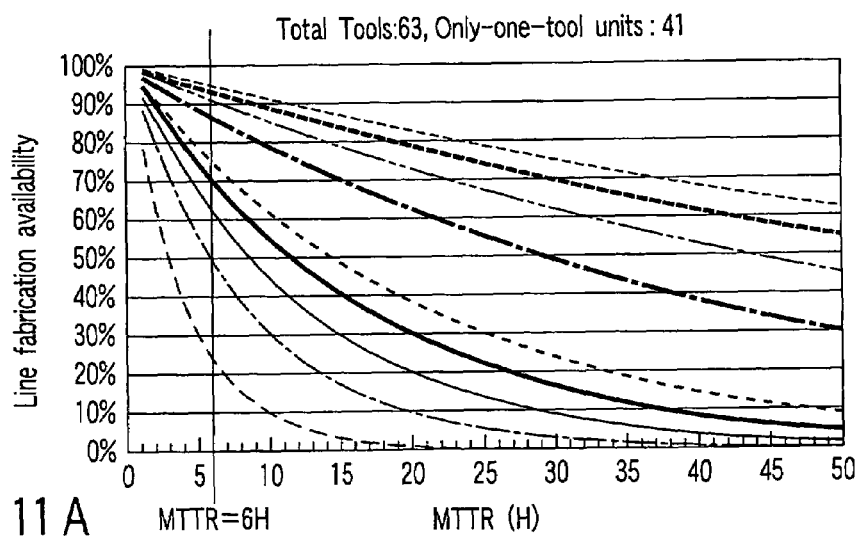
FIG. 10B
FIG. 11A
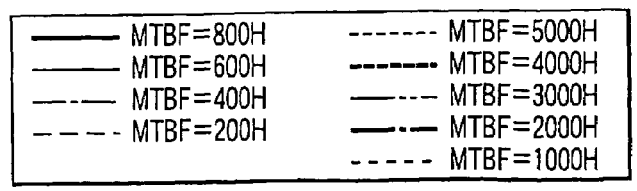
FIG. 11B

Supply functional water from lower side and overflow the water to upper side

Fixing : vacuum suctioning
Removing : blowup

| Classification | Type | | |
|---|---|---|---|
| | One-tool unit group | Two-tool unit group | Three-tool unit group |
| LITHO | 1 | 1 | 0 |
| WET | 4 | 0 | 0 |
| DIFF | 3 | 0 | 0 |
| RTP | 1 | 0 | 0 |
| LPCVD | 2 | 0 | 0 |
| PECVD | 1 | 1 | 0 |
| METAL | 2 | 2 | 0 |
| RIE | 2 | 1 | 0 |
| ASHER | 1 | 0 | 0 |
| IMPLA | 2 | 0 | 0 |
| CMP | 2 | 1 | 0 |
| Number of units | 21 | 6 | 0 |
| Subtotal number of tools | 21 | 12 | 0 |
| Total number of tools | 33 | | |

FIG. 19

| Classification | Type | | | |
| --- | --- | --- | --- | --- |
| | One-tool unit group | Two-tool unit group | Three-tool unit group | Six-tool unit group |
| LITHO | 0 | 1 | 1 | 0 |
| WET | 0 | 0 | 0 | 1 |
| DIFF | 1 | 0 | 0 | 0 |
| RTP | 1 | 0 | 0 | 0 |
| LPCVD | 0 | 0 | 0 | 0 |
| PECVD | 1 | 0 | 0 | 0 |
| METAL | 1 | 2 | 0 | 0 |
| RIE | 0 | 0 | 1 | 0 |
| ASHER | 1 | 1 | 0 | 0 |
| IMPLA | 0 | 0 | 0 | 0 |
| CMP | 0 | 1 | 1 | 0 |
| Number of units | 5 | 5 | 3 | 1 |
| Subtotal number of tools | 5 | 10 | 9 | 6 |
| Total number of tools | 30 | | | |

FIG. 21

| Conventional scale of 1000 Lots per month | | Type | | | | | | | | | | | | | | | |
|---|---|---|---|---|---|---|---|---|---|---|---|---|---|---|---|---|---|
| Classification | 1-tool unit | 2-tool unit | 3-tool unit | 4-tool unit | 5-tool unit | 6-tool unit | 7-tool unit | 8-tool unit | 9-tool unit | 10-tool unit | 12-tool unit | 14-tool unit | 15-tool unit | 16-tool unit | 17-tool unit | 22-tool unit | 27-tool unit |
| LITHO | 0 | 0 | 0 | 0 | 0 | 0 | 0 | 0 | 0 | 0 | 1 | 0 | 0 | 0 | 0 | 0 | 1 |
| WET | 0 | 0 | 2 | 3 | 1 | 2 | 0 | 0 | 1 | 0 | 0 | 0 | 1 | 1 | 0 | 0 | 0 |
| DIFF | 0 | 1 | 1 | 2 | 0 | 0 | 1 | 0 | 0 | 0 | 0 | 0 | 0 | 0 | 0 | 0 | 0 |
| RTP | 0 | 0 | 0 | 0 | 1 | 0 | 0 | 0 | 1 | 0 | 0 | 0 | 0 | 0 | 0 | 0 | 0 |
| LPCVD | 0 | 1 | 1 | 1 | 0 | 0 | 0 | 0 | 0 | 0 | 0 | 0 | 0 | 0 | 0 | 0 | 0 |
| PECVD | 0 | 0 | 0 | 2 | 0 | 1 | 0 | 0 | 0 | 0 | 1 | 0 | 0 | 0 | 0 | 0 | 0 |
| METAL | 0 | 1 | 0 | 0 | 0 | 0 | 0 | 0 | 0 | 0 | 0 | 1 | 0 | 1 | 0 | 0 | 0 |
| RIE | 0 | 1 | 1 | 1 | 1 | 1 | 0 | 0 | 0 | 0 | 0 | 0 | 0 | 0 | 0 | 0 | 0 |
| ASHER | 0 | 0 | 1 | 0 | 0 | 0 | 0 | 1 | 1 | 0 | 0 | 0 | 1 | 0 | 1 | 0 | 0 |
| IMPLA | 0 | 1 | 0 | 0 | 0 | 0 | 0 | 0 | 0 | 0 | 0 | 0 | 0 | 0 | 0 | 0 | 0 |
| CMP | 0 | 0 | 0 | 0 | 1 | 1 | 0 | 0 | 0 | 0 | 0 | 1 | 0 | 1 | 0 | 1 | 0 |
| Number of units | 0 | 5 | 6 | 9 | 4 | 5 | 1 | 1 | 3 | 1 | 2 | 2 | 1 | 3 | 1 | 1 | 1 |
| Subtotal of tools | 0 | 10 | 18 | 36 | 20 | 30 | 7 | 8 | 27 | 10 | 24 | 14 | 15 | 48 | 17 | 22 | 27 |
| Total number of tools | 333 | | | | | | | | | | | | | | | | |

F I G. 28

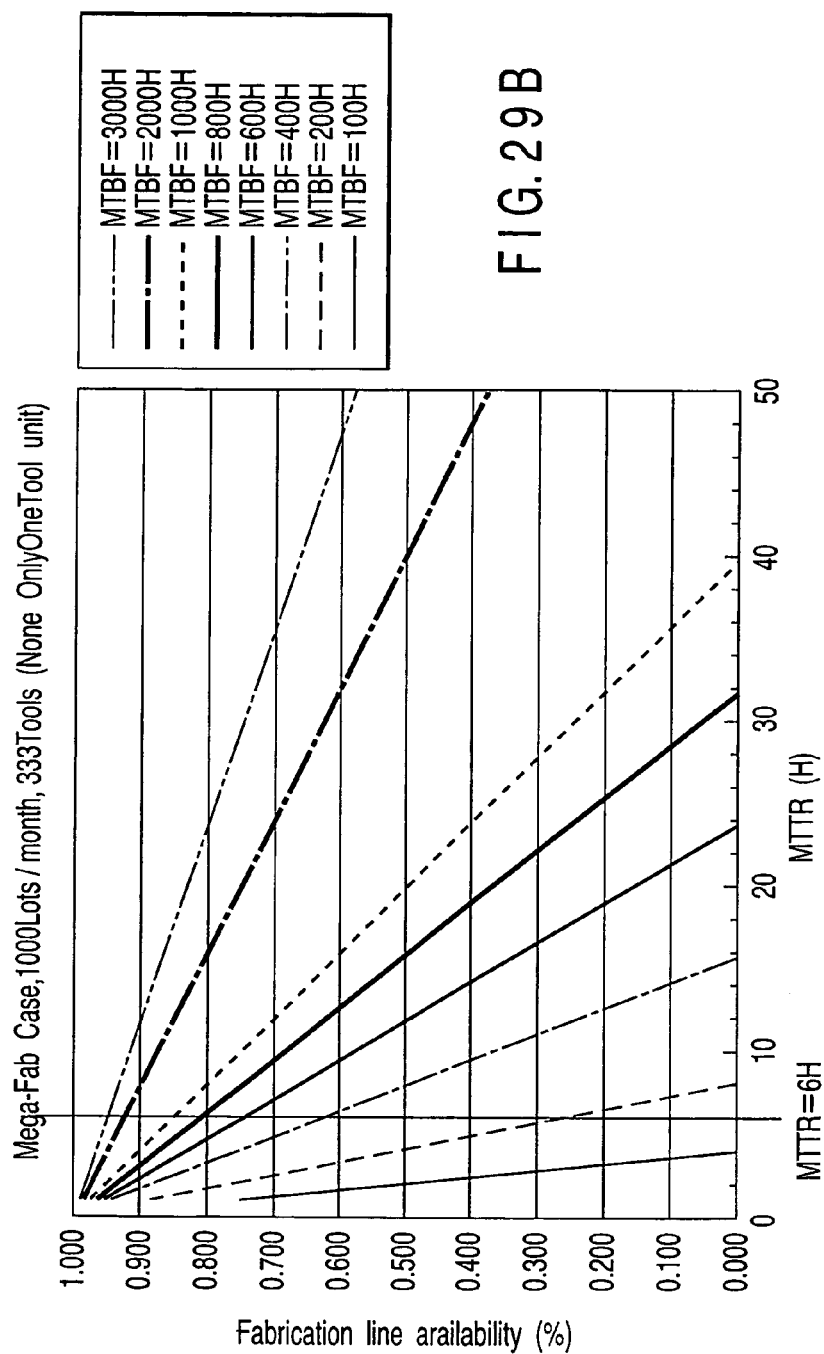

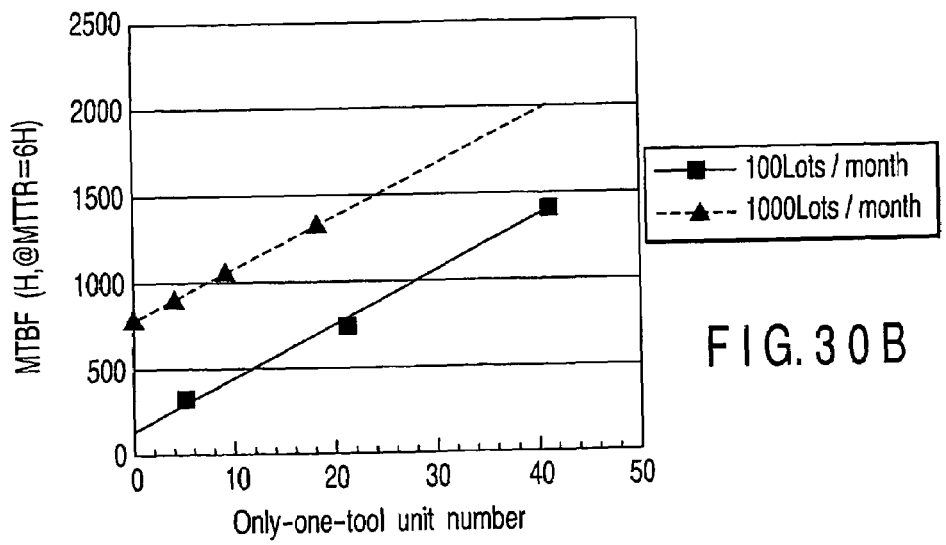
FIG. 30B
FIG. 30A
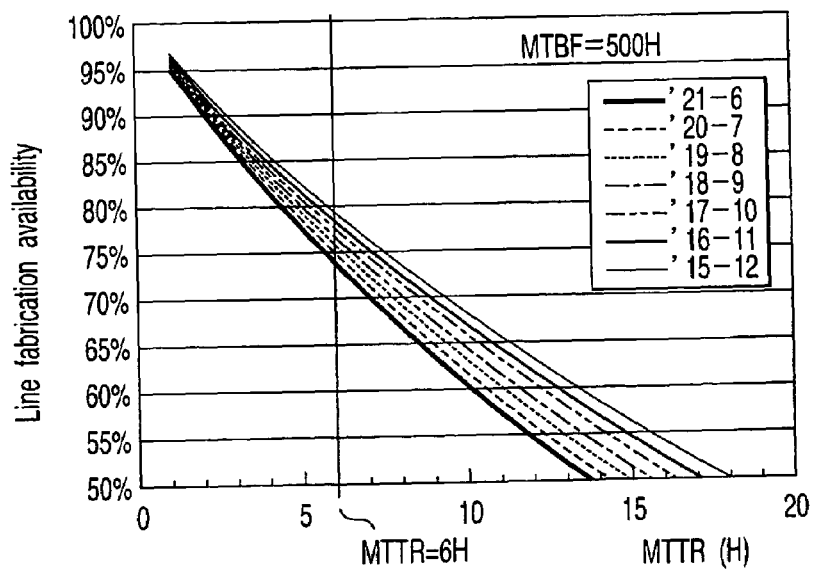
FIG. 31

SEMICONDUCTOR MANUFACTURING LINE AVAILABILITY EVALUATING SYSTEM AND DESIGN SYSTEM

CROSS-REFERENCE TO RELATED APPLICATIONS

This application is based upon and claims the benefit of priority from the prior Japanese Patent Application No. 2003-336248, filed on Sep. 26, 2003, the entire contents of which are incorporated herein by reference.

BACKGROUND OF THE INVENTION

1. Field of the Invention

The present invention relates to an availability evaluating system for evaluating an availability of a semiconductor manufacturing line which includes a plurality of semiconductor manufacturing tools and a semiconductor manufacturing line design system for designing a semiconductor manufacturing line with a high availability.

2. Description of the Related Art

In a semiconductor manufacturing line for fabricating a semiconductor device such as an LSI, it is necessary to equip a plurality of semiconductor manufacturing tools for forming a very small transistors, for example, and further, form metal wirings by applying a variety of processing operations onto a semiconductor substrate. There are several tens or more of processing types for manufacturing a semiconductor device. The same type of processing, for example, wet cleaning processing is carried out a plurality of times until a semiconductor device has been completed. Thus, a semiconductor device is completed through processing steps of several hundreds times in total. Processing type is divided on a step by step basis, and a dedicated semiconductor manufacturing tool is provided in accordance with each step. In order to construct a semiconductor manufacturing line, first, fabrication procedures (a process flow) are determined by a design; type and number of a fabrication tool required to achieve this manufacturing line are determined; and the required fabrication tools are allocated in a clean room. Then, it becomes possible to fabricate a semiconductor device by establishing a processing condition.

In one step of a conventional semiconductor manufacturing line, for example, there is used a semiconductor manufacturing tool for processing 25 wafers (one lot) of 200 mm-diameter by one unit for one hour. Assuming that an operating time of this fabrication tool for one month is 720 hours, this semiconductor manufacturing tool has a large processing capability such that the number of wavers which can be processed for one month is 25×720=18,000 wafers, and the number of lots is 720. In one process flow, one fabrication tool may be used to process only one step or a plurality of steps in the flow according to a processing event. In the case where the semiconductor manufacturing tool previously described as an example processes a plurality of steps in one process flow, the processing capability in each step becomes several thousands of wafers per month (i.e., several hundreds of lots per month). In general, a semiconductor manufacturing process including several hundreds of steps is required in a production scale of 25,000 wafers per month. In the case of using a semiconductor manufacturing tool having the above processing capability, a total number of several hundreds of tools may be used. This total number is obtained from 25,000 wafers per month×several hundreds of steps/18,000 per month for each tool. Therefore, a total number of several tens of tools is necessary in a production scale of 2,500 wafers per month.

In construction of the conventional semiconductor manufacturing line, based on such estimation, a variety of fabrication tools are introduced into the line; each fabrication tool is actually operated; and the fabrication availability of the entire line is finally obtained. When the thus obtained fabrication availability fails to reach a target, a predetermined fabrication availability has been obtained by adding a required number of bottleneck fabrication tools (refer to, for example, Y. Mikata et al; Proceedings of ISSM2001, p7). In a manufacturing line of 25,000 wafers per month, several to some tens of fabrication tools may have a processing function of the same event, and a plurality of tools may be allocated as a dedicated tool or tools for processing a specific step. In this line, even if one tool down occurs, as long as other tools capable of processing the same processing operate, the fabrication availability of the line is hardly affected by such a tool down.

In the semiconductor manufacturing line, there exists a case in which only one fabrication tool is allocated for one processing event (in this case, referred to as an only one-tool unit) or a case in which two or three fabrication tools (a two-too unit or three-tool unit) having the same processing function are allocated to one processing event, as described above. If such a one-tool unit stops, the fabrication availability of the line is greatly affected. However, even if one tool of the two-tool unit or three-tool unit is down or stops, the remaining tool or tools still operate. Thus, no lot flow stoppage occurs, but an effect on the fabrication availability of the line cannot be ignored. In this way, in the one-tool unit, two-tool unit, three-tool unit and the like, an effect on the line fabrication availability when a configuration tool stops must be considered. Conventionally, there has not been provided a technique capable of simply evaluating such an effect.

In contrast, in the line of 2,500 wafers per month, there are many cases in which respective one fabrication tool is allocated to each of plural types of steps, and it is possible to carry out all of processing in a plurality of steps of one type which is targeted to be processed by such one tool. In such a line composed of one-tool units, even if any of such only one-tool units stops, the lot flow or movement of wafers to a next step will stop. Therefore, the line fabrication availability greatly depends on the availability of the one-tool unit. Conventionally, after a semiconductor device manufacturing line has been constructed, and after the fabrication availability of an actual line has been verified, countermeasure has been taken against a unit in a bottleneck step. Specifically, countermeasure is taken by increasing the number of tools in a bottleneck step, i.e., by providing a two-tool unit, for example, instead of an only one-tool unit. However, when a plural-tool unit such as a two-tool unit or a three-tool unit is provided, the number of fabrication tools for carrying out the same processing must be increased. A total number of tools per line increases, thus having caused an increase of tool investment, an increase of running cost, and an increase of clean room space.

As described above, various types of fabrication tool units are provided in a semiconductor device manufacturing line, and an only one-tool unit, a two-tool unit, a three-tool unit and the like are provided for a processing event. From among them, it has been extremely difficult to evaluate an availability of a line in consideration of an effect on the line fabrication productivity when one or more tools stop(s). In addition, one-tool units are mainly provided in a small scale semiconductor manufacturing line, and thus, the lowering of the line availability caused by a failure of such a one-tool unit has been a large problem.

BRIEF SUMMARY OF THE INVENTION

According to one aspect of the present invention, there is provided an availability evaluating system for obtaining an availability of a semiconductor manufacturing line in which it is virtually assumed that a unit group having one or more tool units are serially connected in time series according to a processing event, the system comprising: a unit configured to calculate an incidence probability Xi (i=1 to k) in combination by applying a probability of tool operation and a probability of tool stoppage to all combinations "k" in which at least a line fabrication availability is not zero, of the combinations of operation and stoppage of tools each configuring the semiconductor manufacturing line and by obtaining a product of the probabilities of all the tools; and a unit configured to, when a product between the incidence probability Xi of a combination and a fabrication availability Yi of the combination is defined as a probability converted fabrication availability with respect to each of the combinations, calculate as a line availability a value of $Q=\Sigma_{(i=1\ to\ k)} X1 \times Y1/F$ obtained by dividing a sum of probability converted fabrication capabilities of the combinations by a fabrication availability F determined during a 100% availability.

According to another aspect of the present invention, there is provided a semiconductor manufacturing line design system for designing a semiconductor manufacturing line of an tool configuration in which it is virtually assumed that a unit group having one or more tool units are serially connected in time series according to a processing event, the system comprising: first means for calculating an incidence probability Xi (i=1 to k) in combination by applying a probability of operation and a probability of stoppage to all combinations "k" in which at least a line fabrication availability is not zero, of the combinations of operation and stoppage of units each configuring the semiconductor manufacturing line and by obtaining a product of the probabilities of all the units; second means for, when a product between an incidence probability Xi of a combination and a fabrication availability Yi of the combination is defined as a probability converted fabrication availability with respect to each of the combinations, calculating as a line availability a value of $Q=\Sigma_{(i=1\ to\ k)} X1 \times Y1/F$ obtained by dividing a sum of probability converted fabrication capabilities of the combinations by a fabrication availability F determined during a 100% operation; third means for, when the line availability Q is less than 80%, reconstructing the tool configuration and repeating the calculation by the first and second means; and fourth means for, when the line availability Q is 80% or more, outputting the tool configuration as a proper system configuration.

According to another aspect of the present invention, there is provided an availability evaluating system for obtaining an availability of a semiconductor manufacturing line in which it is virtually assumed that a unit group having one or more tool units are serially connected in time series according to a processing event, the system comprising: defining a total number of units each configuring the semiconductor manufacturing line as "m"; defining a time between failures of units as MTBF and a stoppage time caused by a failure as MTTR; assuming that the stoppage times of the units do not overlap each other, defining a coefficient indicating a degree of lowering Rn as a fabrication availability of a line when one tool of an n-tool unit group has stopped; and calculating a line availability Q as $Q=1-\Sigma_{(i=1\ to\ m)} Rn \times MTTRi/MTBFi$.

According to another aspect of the present invention, there is provided a semiconductor manufacturing line design system for designing a semiconductor manufacturing line of an tool configuration in which it is virtually assumed that a unit group having one or more tool units are serially connected in time series according to a processing event, the system comprising: means for defining a total number of units each configuring the semiconductor manufacturing line as "m"; defining a time between failures of units as MTBF and a stoppage time caused by a failure as MTTR; assuming that the stoppage times of the units do not overlap each other, defining a coefficient indicating a degree of lowering Rn as a fabrication availability of a line when one tool of an n-tool unit group has stopped; and calculating a line availability Q as $Q=1-\Sigma_{(i=1\ to\ m)} Rn \times MTTRi/MTBFi$; means for, when the line availability Q is less than 80%, reconstructing the tool configuration and repeating the calculation; and means for, when the line availability Q is 80% or more, outputting the tool configuration as a proper system configuration.

BRIEF DESCRIPTION OF THE SEVERAL VIEWS OF THE DRAWING

FIG. 1 is a view showing types of processing, steps, and tools required to fabricate one LSI;

FIG. 2 is a view showing a relationship between a processing event and the number of fabrication tools used for the processing event in FIG. 1;

FIG. 5B is a block diagram depicting a configuration of a semiconductor manufacturing line design system using a computer according to one embodiment of the present invention;

FIGS. 9A to 9F are views each showing a case of a combination of a respective one of operation and stoppage when the number of groups of two-tool units ranges from 1 to 3;

FIGS. 10A and 10B are views each showing a plurality of combinations of operation and stoppage of each unit which configures one group of three-tool units;

FIGS. 11A and 11B are views each showing a calculation result of a line availability of an tool configuration shown in FIG. 2 in the case of using a conventional dedicated tool;

FIG. 19 is a schematic view of a manufacturing line of FIG. 2 in the case where the manufacturing line has been formed in a different tool configuration;

FIG. 21 is a view of a line configuration in the case where the manufacturing line of FIG. 18 has been formed in a further different tool configuration;

FIG. 28 is a view of a line configuration when the manufacturing line has been formed in a further different tool configuration;

FIGS. 29A and 29B are views each showing a result of calculating an availability of the manufacturing line of the tool configuration of FIG. 28 in accordance with a simplified calculation formula;

FIGS. 30A and 30B are views each showing a result of calculating a relationship of an MTBF and the number of one-tool units required to obtain a line availability of 80% with respect to a mini-fabrication (100 Lots per month) and a maga-fabrication (1000 Lots per month); and FIG. 31 is a view showing a result of calculating a line availability in the case where a tool corresponding to a one-tool unit has been added.

DETAILED DESCRIPTION OF THE INVENTION

Hereinafter, embodiments of the present invention will be described with reference to the accompanying drawings.

(First Embodiment)

For example, in wafer processing included in a semiconductor manufacturing line, the types of process are roughly divided into 10 processes as shown in FIG. 1, and an illustrated dedicated process tool is provided in accordance with each of the steps. That is, a coating tool, a developing tool, an exposure tool and the like are provided for a lithography process. A heat treatment furnace tool and a lamp annealing tool are provided for oxidization and high temperature CVD film and annealing steps, respectively. A wet cleaning tool is provided for a wet cleaning process. An ion implantation tool is provided for a doping process. An RIE tool is provided for an etching process. A P-CVD tool, an epitaxial tool and the like are provided for a thin film forming process. A sputtering tool, a plating tool and the like are provided for a wiring (metal forming) process. A CVD tool, a coating tool and the like are provided for a wiring (interlayer film forming) process. A CMP tool is provided for a CMP process.

The present embodiment assumes a comparatively small scaled line of 2,500 wafers per month, and the units and the number of tools for each process are determined as shown in FIG. 2.

Here, as shown in FIG. 2, a unit having only one tool for each step is referred to as a one-tool unit group A. A unit having two tools is referred to as a two-tool unit group B. A unit having three tools is referred to as a three-tool unit group C. As shown in FIG. 2, the one-tool unit group requires 41 units; the two-tool unit group requires 8 units; the three-tool unit group requires 2 units; and a total number of tools is 63. That is, a majority of steps requires only one-tool units.

Figure 3A:
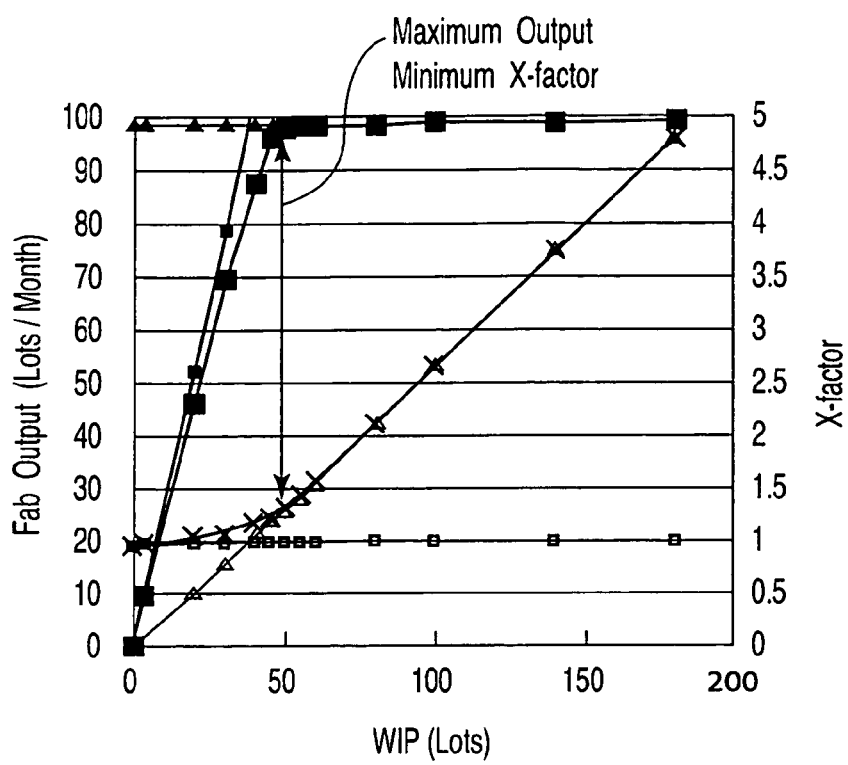
FIGS. 3A and 3B are views each showing a relationship among the number of wafers to be processed in a manufacturing line (wafers in process: WIP); a fabrication quantity (Fab. Output); and a ratio between an actual schedule and a theoretical schedule (X-factor)
Figure 3B:
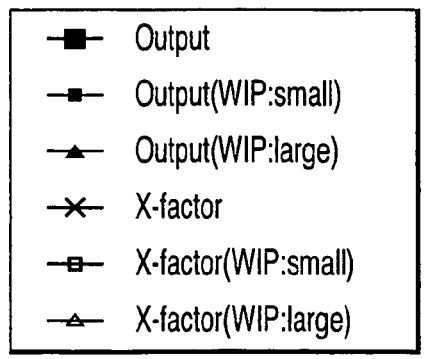

If one or more tools in the units of a manufacturing line stop during failure, maintenance or tool condition check, the production availability of a line changes. In recent years, it has been necessary to minimize a fabrication turn around time (TAT) and then, quickly respond to a customer's demand, and reduce a loss of a business chance. In order to achieve this, there is a need for making an actual TAT close to a theoretical TAT by minimizing unfinished products in process in the manufacturing line and reduce products to be processed. For example, it is found that a relationship shown in FIG. 3A is established among a WIP (Wafer In Process); a fabrication output; and X-factor (a value obtained by dividing an actual TAT by a theoretical TAT) (reference: Y. Mikata et al: Proceedings of ISSM2001, p. 7); and that the TAT close to the theoretical TAT can be obtained by adjusting the WIP. FIG. 3B shows a reference for identifying a graph of FIG. 3A. In this case, the WIP is 50, and only a few products (wafers) are in an idling state to be processed in the line.

In the case where production is carried out in such a state, if a tool in the line stops, no product is supplied in the subsequent tool or step. In particular, if no product is supplied to a bottleneck tool with a high availability, the line output decreases. In general, there are 100 steps in the case of LSI manufacturing, and a plurality of bottleneck tools exist in the steps. Thus, even if any of the units in any step stops, the bottleneck unit is affected, and the fabrication output decreases.

Figure 4A:
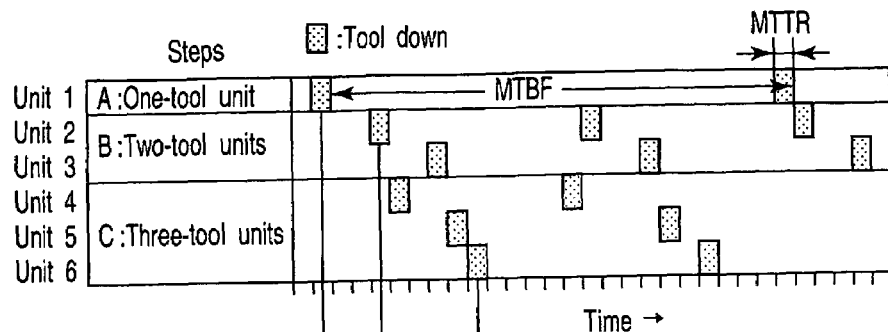
FIGS. 4A, 4B and 4C are schematic views each showing a relationship between a mean time between failures (MTBF) in each fabrication tool in the case where an availability of the manufacturing line is obtained; and a mean stoppage time (mean time to repair: MTTR) from the failure of each tool to repair.
Figure 4B:
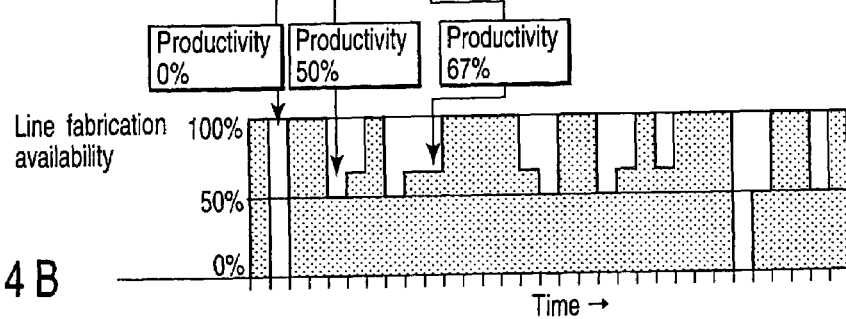
Figure 4C:
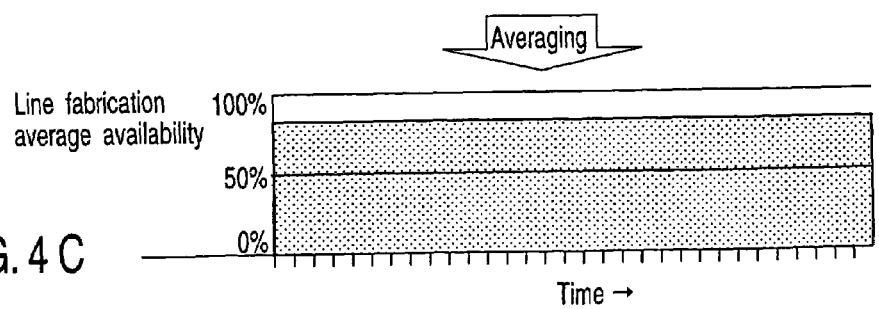

Assuming that the fabrication output is a fabrication availability of the line with reference to the schematic views as shown in FIGS. 4A to 4C, line fabrication stops when a tool stops in the one-tool unit group A. If one tool stops in the two-tool unit group B, the availability is 50%. If one tool stops in the three-tool unit group C, the availability is 67%. That is, in the two- or more tool unit group, when one tool stops, it is deemed that the line fabrication availability is determined by summation of the processing capabilities of the unit groups in which the remaining tools operate. In order to obtain availability of the entire line, a rate at which a combination of unit stoppages occurs is first obtained, and the line fabrication availability in that combination is calculated, and then an average availability of the line can be found by a sum of these calculations.

Figure 5A:
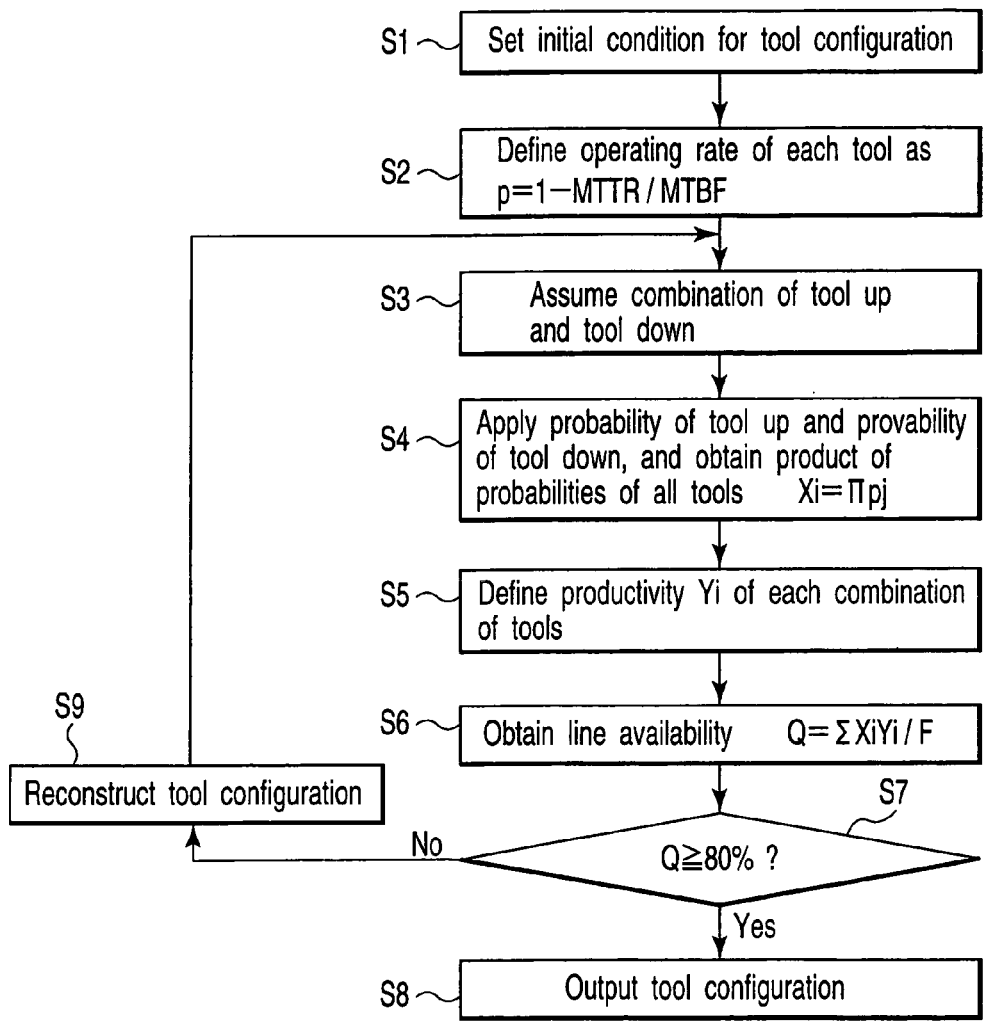
FIG. 5A is a flow chart illustrating an operation of a semiconductor manufacturing line design system shown in FIG. 5B.

FIG. 5A is a flow chart illustrating a semiconductor manufacturing line design system according to a first embodiment of the present invention. This operation is carried out by the procedures using a computer system including a computer 1 as shown in FIG. 5B, but a dedicated circuitry may be provided.

Figure 6:
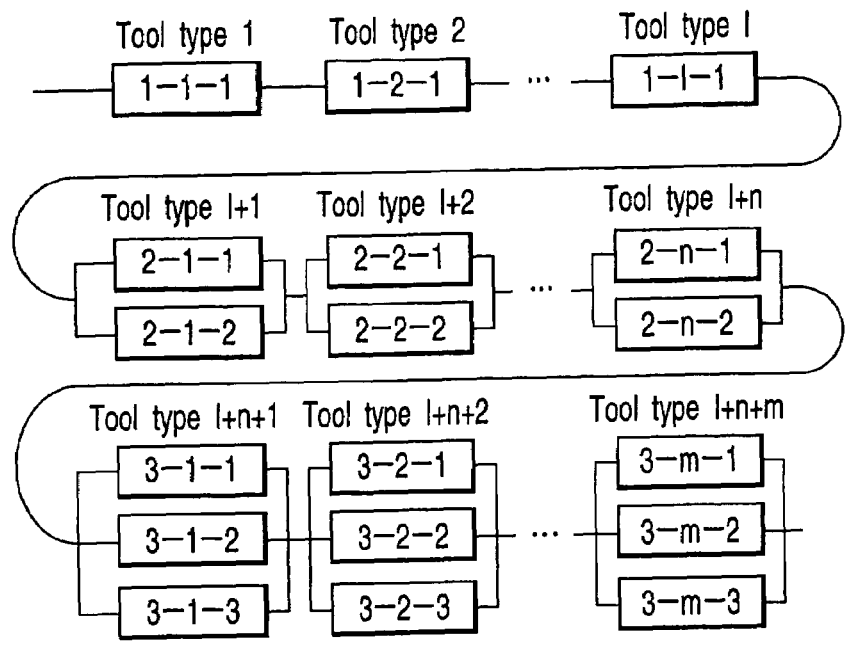
FIG. 6 is a schematic line flow chart for calculating a line availability using a one-tool unit, a two-tool unit, and a three-tool unit.

In FIG. 5A, first, an initial condition of a unit configuration is set by using an input device 2 (step S1). That is, based on the numbers of tools in the one-tool unit group, two-tool unit group, and three-tool unit group, the unit configuration in which these units are connected to each other in time series, as shown in FIG. 6, is set as an initial condition.

Next, in the computer 1, an availability of each unit is defined as p=1−MTTR/MTBF (step S2). For example, in a unit configuration shown in FIG. 6, when a mean time between failures of each tool is defined as MTBF (Mean Time Between Failures), and an average stoppage time caused by a failure is defined as a MTTR (Mean Time To Repair), a stoppage rate of each tool is expressed as an MTTR/MTBF. Here, for simplification, a stoppage rate of each tool is assumed to be equal to another one. An availability "p" of each unit is obtained by subtracting a stoppage rate of each tool from the entirety. Thus, the following formula is established.

$$p = 1 - \text{stoppage rate} = 1 - MTTR/MTBF \quad (1)$$

A tool stoppage is caused not only by a failure but also by maintenance, a state check of a tool or the like. The MTBF and MTTR used here are deemed to be a tool stoppage interval and a stoppage time including these activities such as maintenance or a state check of a tool in broad sense.

A line availability of the entire tool configuration shown in FIG. 6 is calculated in accordance with the following procedures using the computer 1.

Figure 7:
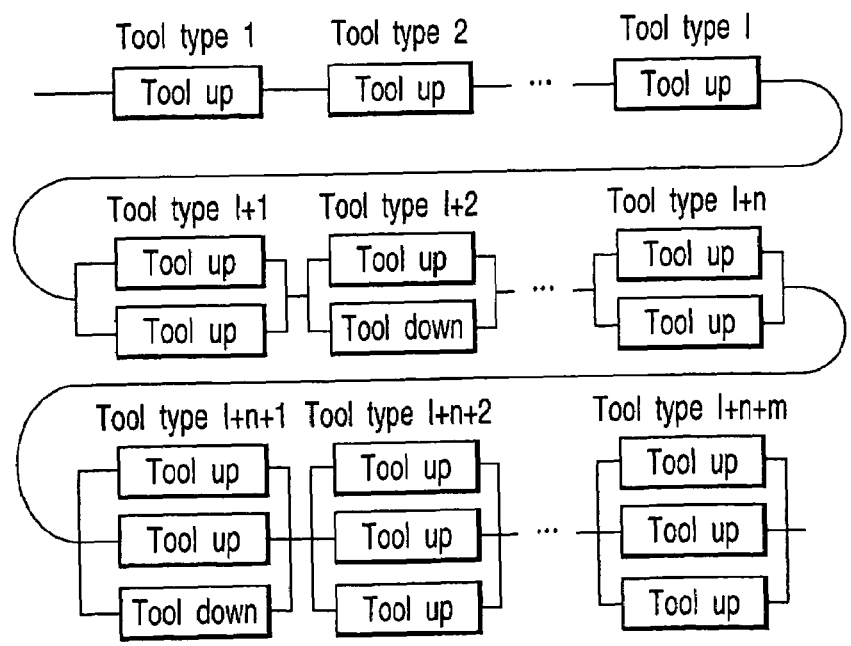
FIG. 7 is a view illustrating operation and stoppage of each unit in the schematic line flow of FIG. 6.

(1) A combination of certain operation and stoppage as shown in FIG. 7 is assumed relevant to the tool configuration shown in FIG. 6 (step S3). At this time, a case where all the tools stop in each of the unit groups is not deemed because the line fabrication availability becomes zero. In view of programming, even if calculation is made including the case where the line fabrication availability is 0, the calculation result is kept unchanged (because zero is added). Thus, all combinations including the case of zero may be calculated.

Figure 8:
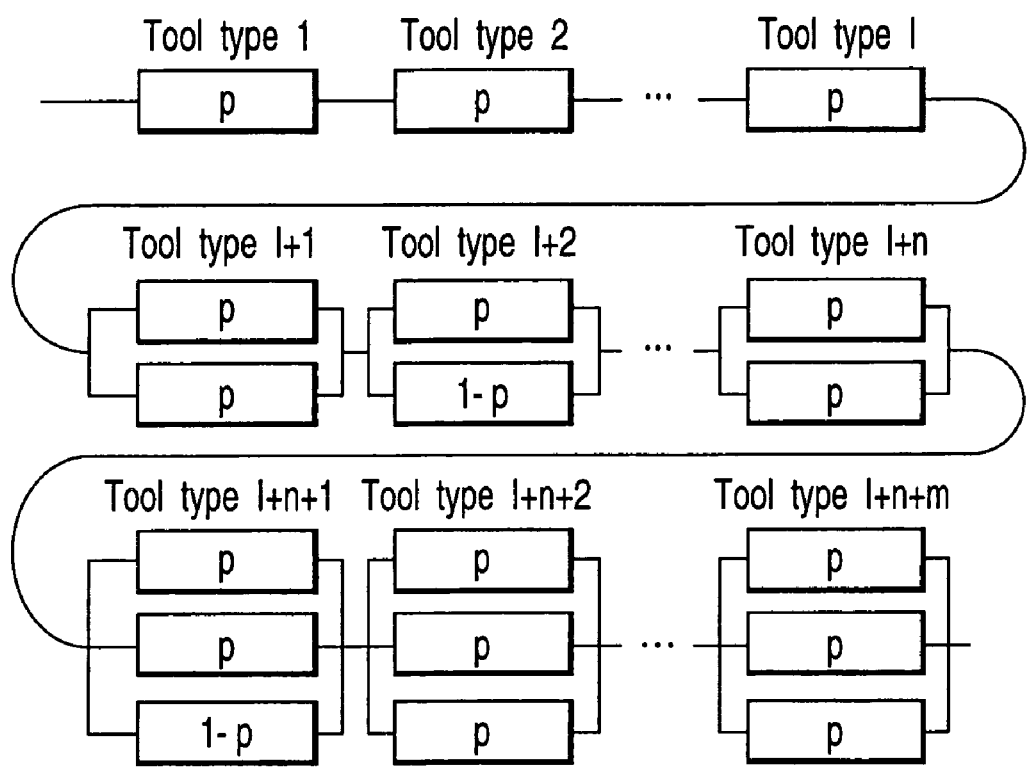
FIG. 8 is a view allocating and showing a probability of operation of each unit and a probability of stoppage in FIG. 7.

(2) A probability of operation and a probability of stoppage (=1−operation probability) as shown in FIG. 8 is applied for a combination of operation and stoppage; a product of the probabilities of all the units is obtained; and a probability of generating such a combination is obtained (step S4). The probability "Xi" of generating the combination is expressed in the following formula.

$$Xi = \Pi p_j \text{ (unit)} \quad (2)$$

wherein Π denotes a product (total product) of probabilities of an availability "$p_j$" of all the tools.

(3) A fabrication availability of each combination is assumed to be a sum of fabrication capabilities of the tools operating in a plural-tool unit group. A fabrication availability of the smallest unit group from among all the unit groups (unit type 1 to 1+n+m) is defined as a fabrication availability Yi of that combination (step S5).

(4) A product between the probability Xi of generating a combination and the fabrication availability Yi of that combination is assumed to be a probability converted fabrication availability in that combination. In this way, with respect to each of the combinations, the product between the probability Xi of the generating a combination and the fabrication availability Yi of that combination is assumed to be a probability converted fabrication availability Xi×Yi; and a value obtained by dividing a sum of the probability converted fabrication availability X1×Vi of each of the combinations by a fabrication output F determined during a 100% operation is calculated as a line availability Q (step S6).

$$Q = \Sigma_{(i=1-k)} Xi \times Yi/F \quad (3)$$

Next, it is determined whether or not the line availability Q calculated as described above is 80% or more (step S7). When the availability Q is 80% or more, a current tool configuration is outputted as a proper system configuration (step S8). As this output, for example, tool configuration data may be written into an external memory device 4 of FIG. 5B or a system of the obtained tool configuration may be printed by a printer 3.

When the availability Q is less than 80%, a one-tool unit group is reduced by a technique described later, thereby reconstructing the tool configuration (step S9). Then, processing reverts to step S3 in which a combination of operation and stoppage is redeemed. Then, steps S3 to S6 are repeated until the line availability becomes 80% or more, whereby a tool configuration in which the line availability Q is 80% or more can be obtained.

Now, a specific technique for calculating an availability will be described with respect to a case where there are two tools of the same type in a unit. In order to make a calculation relevant to all the combinations, such a calculation can be made in the case where a small number of two-tool units exist. However, if the number of such units increases, the number of combination cases increases. For example, when there are 20 two-tool units, the number of combination cases must be calculated as described in (4) above with respect to a combination of 40 units. That is, for example, when there are 3 two-tool units, combinations as shown in FIGS. 9A to 9F must be deemed except that a line operation stops.

When there is only one two-tool unit, there are three combinations as shown in FIGS. 9A and 9B. In the case of the 2 units as shown in FIG. 9C, there are 9 combinations as shown in FIG. 9D. In the case of the 3 two-tool units as shown in FIG. 9E, there are 27 combinations as shown in FIG. 9F. In the case of the 20 units, there are $3^{20}$=3,486,784,401 combinations. If there are more units, the number of cases becomes a number such that calculation is impossible within a short period of time. Therefore, in the case where there are several hundreds of two or more tool unit groups, the number of cases is $10^{100}$ or more, and calculation of probability is not easy. Further, in the case of the three-tool unit, there are the combinations as shown in FIGS. 10A and 10B. In the case where there is one three-tool unit, there are 7 combinations as shown in FIG. 10B. In the case of the 2 units, there are 49 combinations. In the case of the 3 units, there are 343 combinations. In the case of the 10 units, $7^{10}=7.979\times10^{16}$ combinations, and combination calculation cannot be made easily.

In contrast, in a small sized line of about 100 L (lots) per month, the number of tools is less then 50 at maximum. In addition, there are a number of one-tool units, and thus, the number of cases is within a permissible range for calculation. In actuality, an example of calculation for obtaining a line availability in the case of a conventional dedicated tool is shown below.

In a tool configuration, as shown in FIG. 2, there are 41 one-tool units; 8 two-tool units; and 2 three-tool units.

In this case, the line availability for one-tool unit groups are obtained as a product of the availabilities of the respective units, namely, a 41st power of the availability. On the other hand, in calculating a probability and fabrication availability of a respective one of the two-tool units and three-tool units, calculations of the incidence probability are made for a total of 6561×49= 321489 combinations where $3^8=6561$ combinations relevant to 8 two-tool units and 7×7=49 combinations in the case of 2 three-tool units shown in FIGS. 10A and 10B. Then, the fabrication capabilities are multiplied with respect to each of the cases, and a sum of these capabilities is obtained, whereby a line availability is obtained. Here, with respect to the fabrication availability of each case, calculation has been made when a decimal portion of a quotient obtained by dividing a set line production capability by a processing capability of one tool is assumed to be 0.5. This is because an average value is 0.5 in the case where a plural-tool unit has been set as described later.

With respect to a relationship between the line availability and the MTTR or MTBF, the results shown in FIGS. 11A and 11B are obtained in the case of a conventional dedicated tools. From FIG. 11A, consider a case in which MTTR=6 H (hours) because the current average MTTR is 6 H. In order to ensure that the line availability is 80% or more, the MTBF must be 1470 H or more between MTBF=1000 H and MTBF=2000 H. Because the MTBF of the current semiconductor manufacturing tool is 1000 H or less, it is found that a manufacturing line using the dedicated tool cannot be realized at an availability of 80% or more.

In order to increase the tool MTBF, it is necessary to revise a tool design, and thus, it is difficult to make improvement immediately. When fabrication is carried out in the same fabrication process while the tool MTBF is currently used, the line availability can be increased by changing the line tool configuration in the present embodiment. The one-tool unit group may affect greatly to the line availability, and therefore, it is important to reduce the number of one-tool units in the one-tool unit group.

In order to achieve this goal, it is effective that the same tool is used for a plurality of processing operations in common. As is evident from FIG. 2, with respect to the one-tool units, the numbers of units of the respective WET tools, RIE tools, LP-CVD tools, and DIFF (oxidization/ diffusion) tools are 4 or more. It is important to reduce the number of these one-tool units.

In the Wet tool, conventionally, each of the wet cleaning tanks or fluid vessels has been fixedly allocated for wet cleaning each of a variety of objects. A dedicated wet cleaning fluid has been reserved in a predetermined fluid vessel to carry out the wafer washing in the vessel. The tools have been classified for each washing condition. In addition, this wet cleaning tool is of reservoir type, and thus, the tools have been used exclusively for each step in consideration of cross contamination of polluted materials.

Figure 12A:
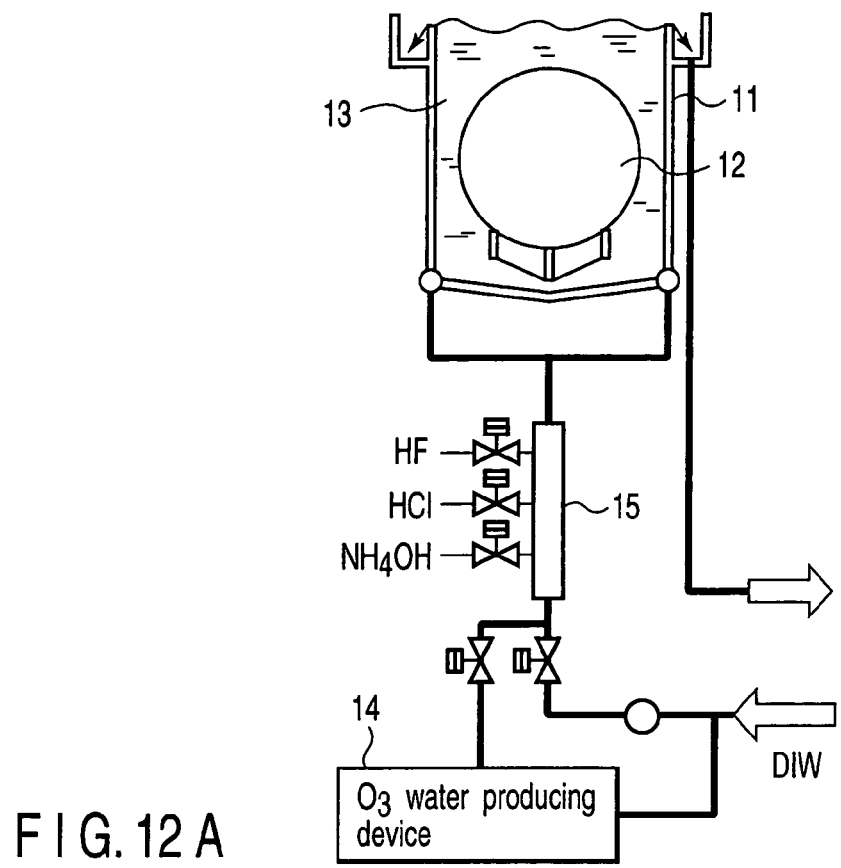
FIGS. 12A and 12B are schematic views each showing an example of a wet cleaning tool serving as a tool using a one-bath (one fluid vessel) scheme.
Figure 12B:
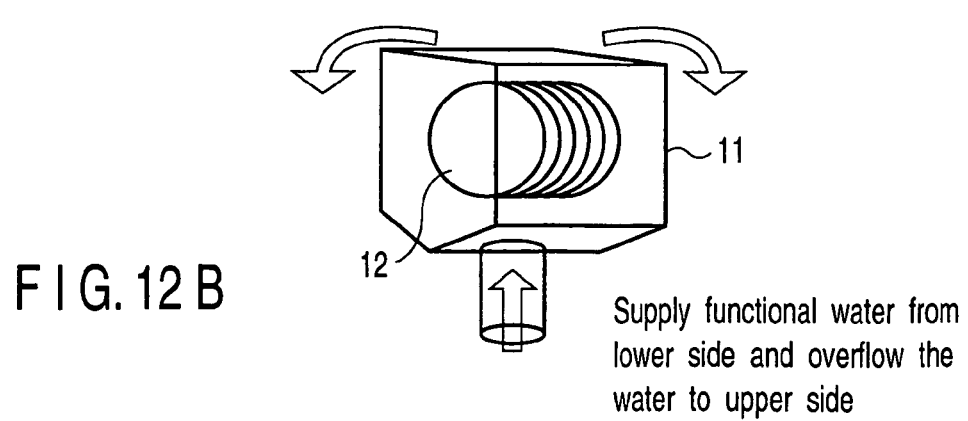

In contrast, as shown in FIGS. 12A and 12B, wet cleaning is carried out while wet cleaning fluid is supplied to one wet cleaning vessel 11, and the wet cleaning fluid is changed for each wet cleaning step. In a so-called one-bath scheme using the common wet cleaning bath or vessel, there is no worrying about cross contamination because the wet tool is not of reservoir type. In this manner, the number of wet cleaning steps which can be carried out by one tool increases from one to several steps, and the number of tools or units can be decreased to ¼, for example.

FIG. 12A shows an entire configuration of the wet tool, and FIG. 12B shows a configuration of a one-bath wash tank portion 11. Further, in the one-bath wash vessel 11 in the figure, reference numeral 12 denotes a semiconductor wafer; reference numeral 13 denotes a wet cleaning fluid; reference numeral 14 denotes an $O_3$ water production device; and reference numeral 15 denotes a flow rate control portion.

In addition, in the RIE tool, etching is carried out while a gas type, a flow rate, a pressure, and a high frequency power quantity are changed according to the film type and structure targeted for etching. Thus, the thickness, composition and the like of a fluorocarbon film adhered to a chamber wall of the RIE tool are different depending on an etching condition. When etching in a different condition is made in the same chamber, a film deposited on the chamber wall is removed, and particles of the removed material are generated. Then, gas is discharged or adsorbed from the film of the wall; the etching condition changes; and there occurs a state in which a desired etching shape or selection rate cannot be obtained. Therefore, the RIE tool has been used as a so-called dedicated tool which carries out only etching under the same condition in the same chamber.

In contrast, it is possible to make chamber cleaning by reacting the fluorocarbon film adhered to the chamber wall with an oxygen plasma so as to carry out gasification and removal. After the chamber is thus cleaned, even if a next etching condition is changed, the generation of particles and a change of etching characteristics do not occur because no fluorocarbon film is adhered to the chamber wall. Thus, a different etching condition can be used for the same chamber.

Figure 13:
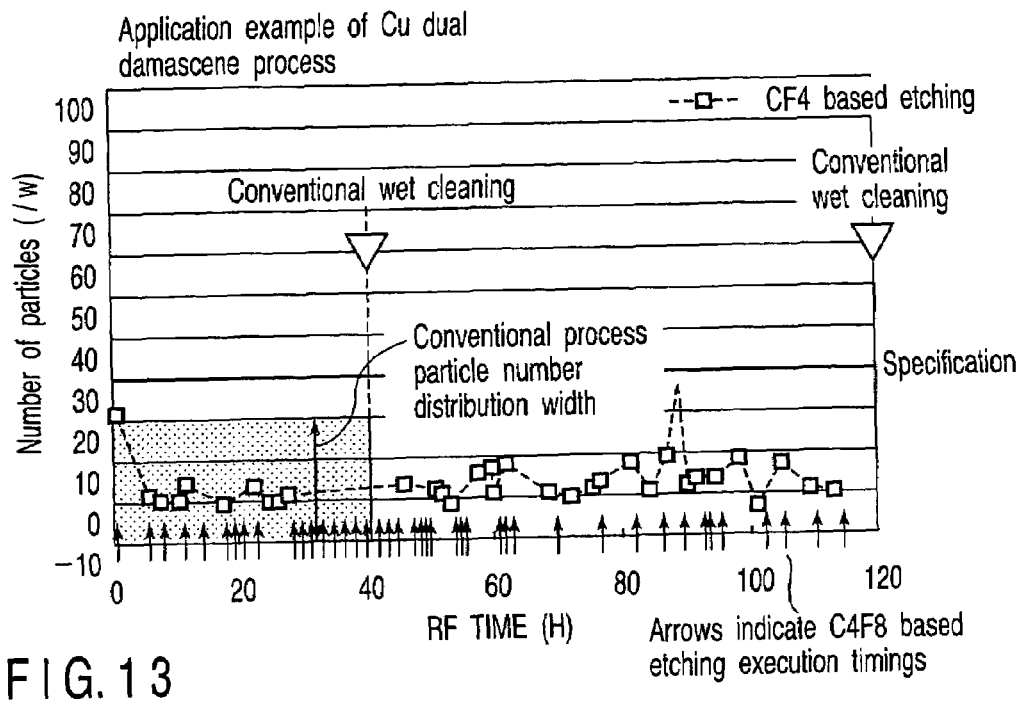
FIG. 13 is a view showing a distribution of the number of particles in the case where a different type of process has been shared by changing an etching condition in an RIE tool.
Figure 14:
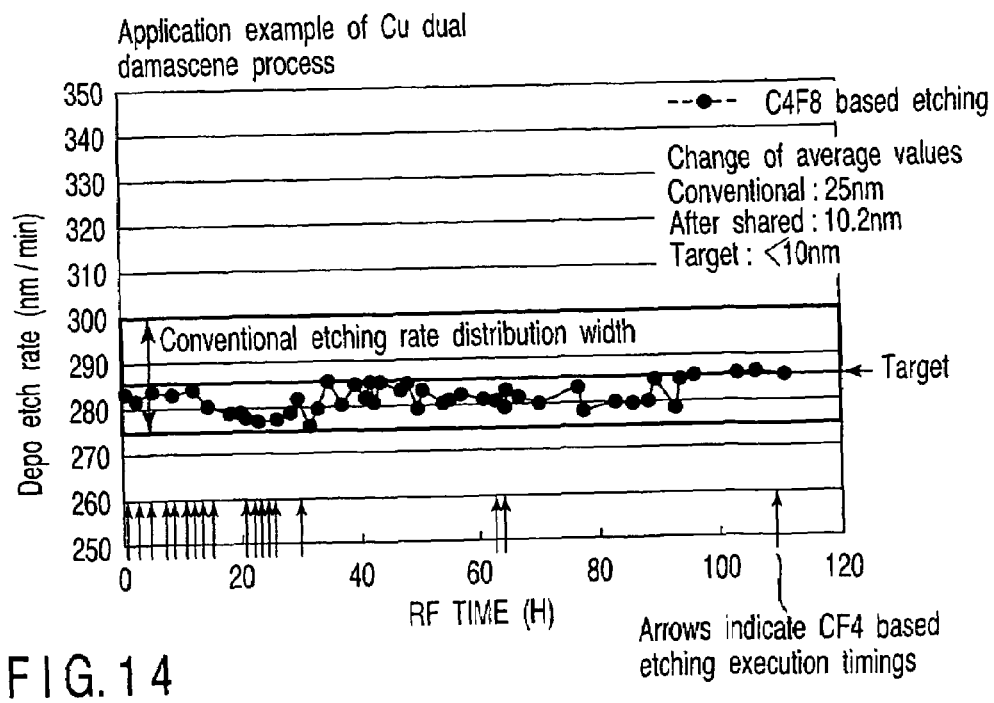
FIG. 14 is a view showing a distribution of an etching rate in the case where a different type of process shown in FIG. 13 has been shared in the RIE tool.

FIG. 13 shows a distribution of the number of particles in the case where chamber cleaning is made every after each etching process for 25 wafers (1 lot) is finished. FIG. 14 shows a distribution of an etching rate during the etching processes in the case of FIG. 13. There is no problem because the number of the generated particles do not increase until a period of time (referred to as RF TIME) during which a plasma is produced has reached 120 H. In addition, with respect to an etching rate, a result is obtained, which indicates that the etching rate is less changed than conventionally.

Figure 15:
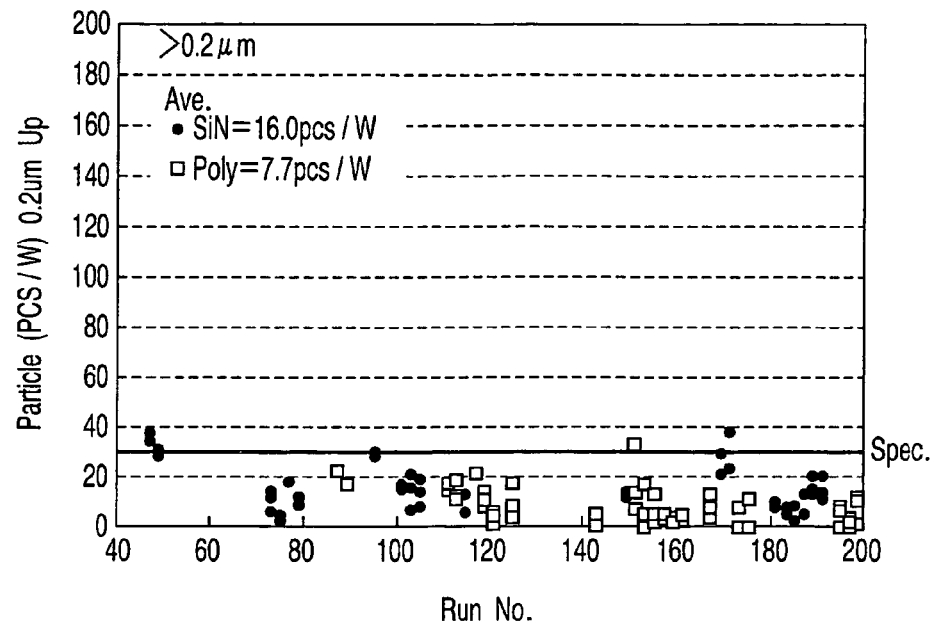
FIG. 15 is a view showing a distribution of the number of particles in the case where an LP-CVD tool has been shared for such a different type of process.
Figure 16:
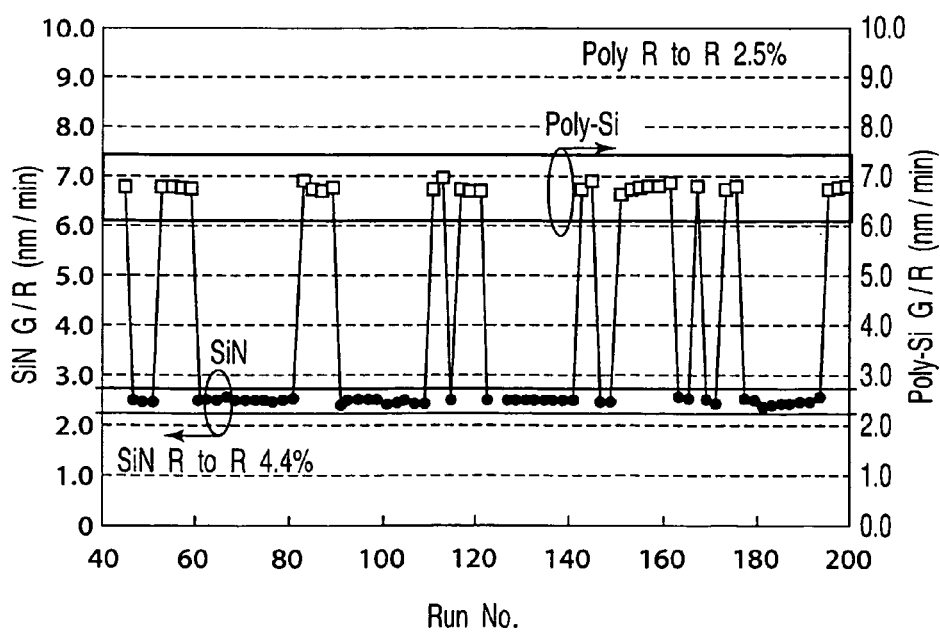
FIG. 16 is a view showing a distribution of a film depositing rate in the case where the LP-CVD tool has been shared in such a different type of process.

The conventional LP-CVD tools are exclusively used for each film type as well. If a common LP-CVD tool is used for forming different type films, there has been a problem that, in the case where the films deposited in a quartz reactor pipe in the LP-CVD furnace is different from each other in type, the film may be removed from the furnace wall by a stress between the different type films, whereby a large amount of particles are generated. In order to prevent the generation of such particles, the deposited films may be removed. When film etching for each deposited film is carried out every after the LP-CVD is made, it is possible to form different types of films using a common LP-CVD tool. FIG. 15 shows particle data in the case where two types of films, poly-Si and SiN, have been alternately formed in the same furnace by using a halogen based gas etching. FIG. 16 shows data on a film deposition rate in the furnace used in the case of FIG. 15 steps. Thus, even if a number of film forming processes of different film types are carried out, the particles are within the specified range, and the reproducibility and stability of the film deposition rate are good as well.

With respect to the DIFF (oxidization and diffusion) tool as well, cleaning is carried out similarly every time the DIFF process is made, thereby enabling processing under different process conditions.

Figure 17:
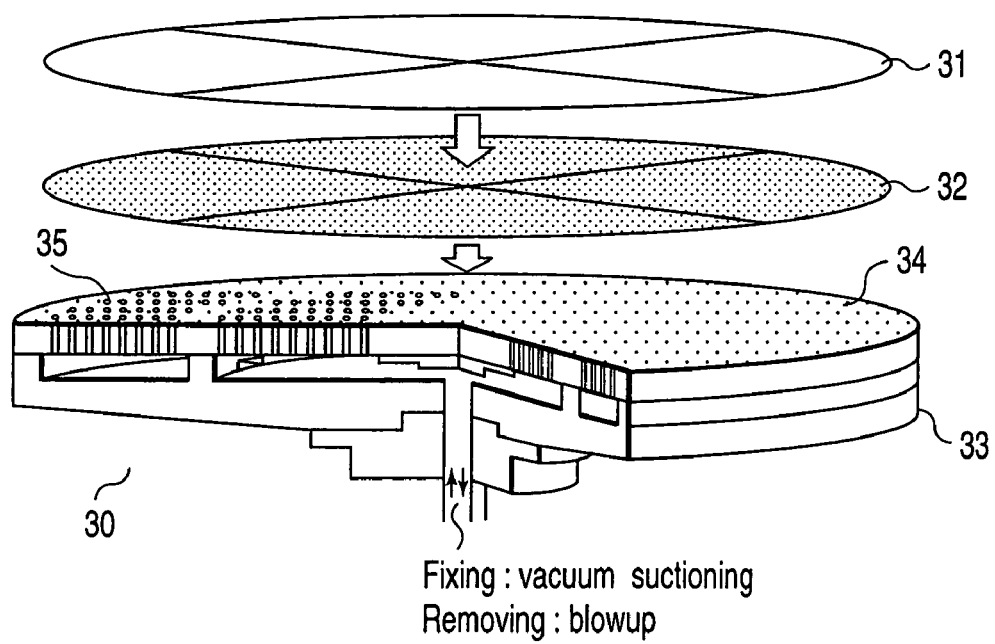
FIG. 17 is a perspective view showing a configuration for dividing a polishing pad in a CMP tool, and easily replacing the polishing pad by means of vacuum adsorption.

Lastly, with respect to the CMP tool, it has been indispensable to replace a polishing pad and slurry with the different ones in order to carry out polishing of a different type of film. In order to carry out replacement and conditioning, a certain amount of time intervals (several hours) are required, thereby reducing the processing capability of the tool. Conventionally, dedicated tools should have been used exclusively. In order to solve this problem, as shown in FIG. 17, a polishing pad 31 and a cartridge plate 32 are divided into several pieces (four, in this case). The divided pad 31 and plate 32 are held on a turn table 30 by means of vacuum suction through the suction holes 35 formed in the turn table 30. The pad 31 and plate 32 can be easily removed by stopping the vacuum suction and blowing up the pad 31 and plate 32 through the suction holes 35, thereby easily replacing the pad 31 with a new replacement pad. In this manner, the replacement can be carried out within 20 minutes. Thus, even in the case of polishing a different type of film, processing can be carried out without significantly reducing the processing capability even in the same CMP tool. In the figure, reference numerals 33, 34 each denote a stationary disk which configures a turn table 30; reference numeral 33 denotes a lower stationary disk; reference numeral 34 denotes an upper stationary disk in which the suction holes 35 are formed.

Figure 18A:
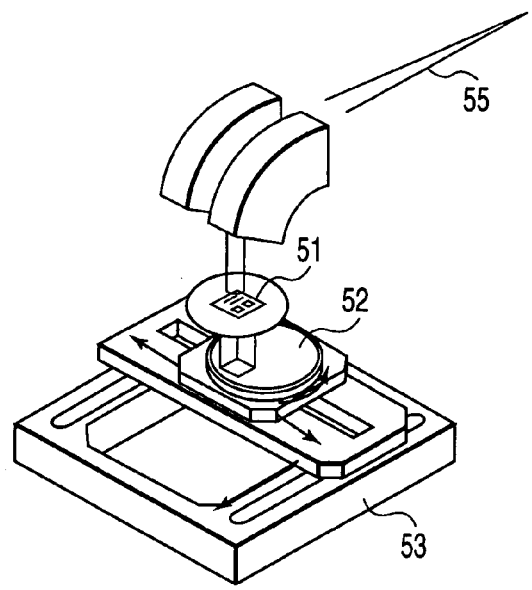
FIG. 18A is a perspective view showing a schematic configuration of an ion implantation tool using a stencil mask.
Figure 18B:
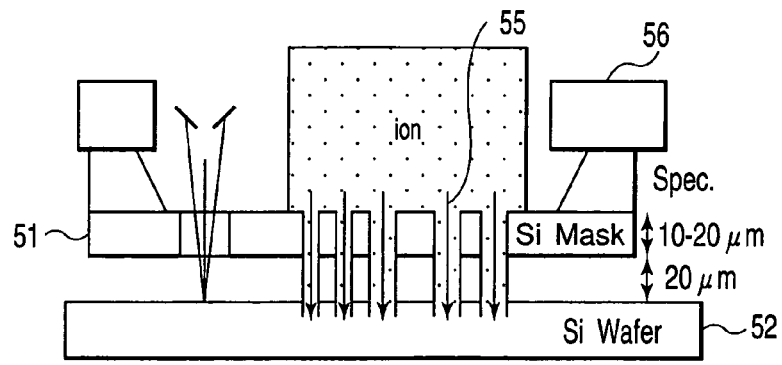
FIG. 18B is a view schematically showing a sectional structure of the ion implantation tool shown in FIG. 18A.
Figure 18C:
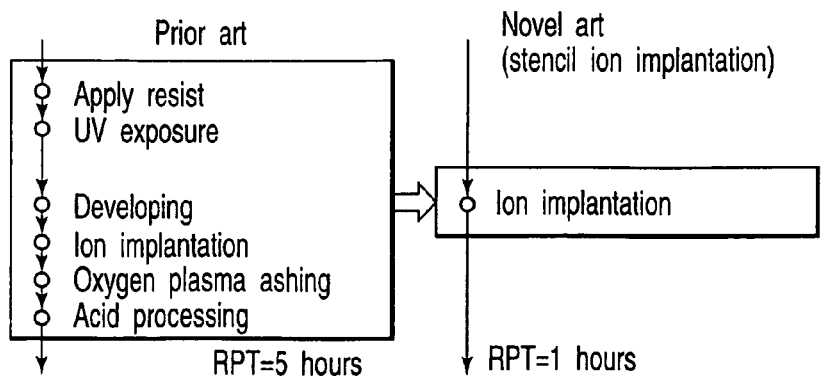
FIG. 18C is a view showing an operation of the ion implantation tool of FIGS. 18A and 18B as compared with a conventional tool.

In the conventional ion implantation process, a resist pattern has been formed by carrying out lithography, and the ion implantation has been carried out on a wafer with the resist pattern as a mask. However, according to the present embodiment, the number of lithography tools has been successfully reduced, and some of the ion implantation (IMPLA) tools have been successfully shared in several steps by means of a stencil mask ion implantation in which a stencil mask is inserted into an IMPLA tool as shown in FIGS. 18A to 18C. The ion implantation is carried out for a desired portion through the stencil mask, and carrying out a step-and-repeat operation on the wafer, thereby carrying out ion implantation for a full surface of the wafer.

FIG. 18A is a perspective view of an ion implantation tool using a stencil mask; and FIG. 18B is a sectional view of the tool, wherein reference numeral 51 denotes a stencil mask, reference numeral 52 denotes a Si substrate, reference numeral 53 denotes an XYZ stage, reference numeral 55 denotes an ion beam, and reference numeral 56 denotes a reference plate. In addition, FIG. 18C is a view showing a comparison with respect to a conventional method. The figure shows that the steps of resist coating, exposure, developing and the like can be eliminated, and a processing time is reduced by using the stencil mask.

By taking the above described measures, a different type of step can be processed in the same tool; the same tool can be shared, and thus, the number of tools can be reduced. As shown in FIG. 19, in order to fabricate pure-logic elements of 6 multi-layered wires by 100 L per month, only the 21 one-tool units and 12 two-tool units may be provided, and the number of one-tool units has been successfully reduced to about ½ as compared with the tool configuration of FIG. 2.

Figures 20A, 20B:
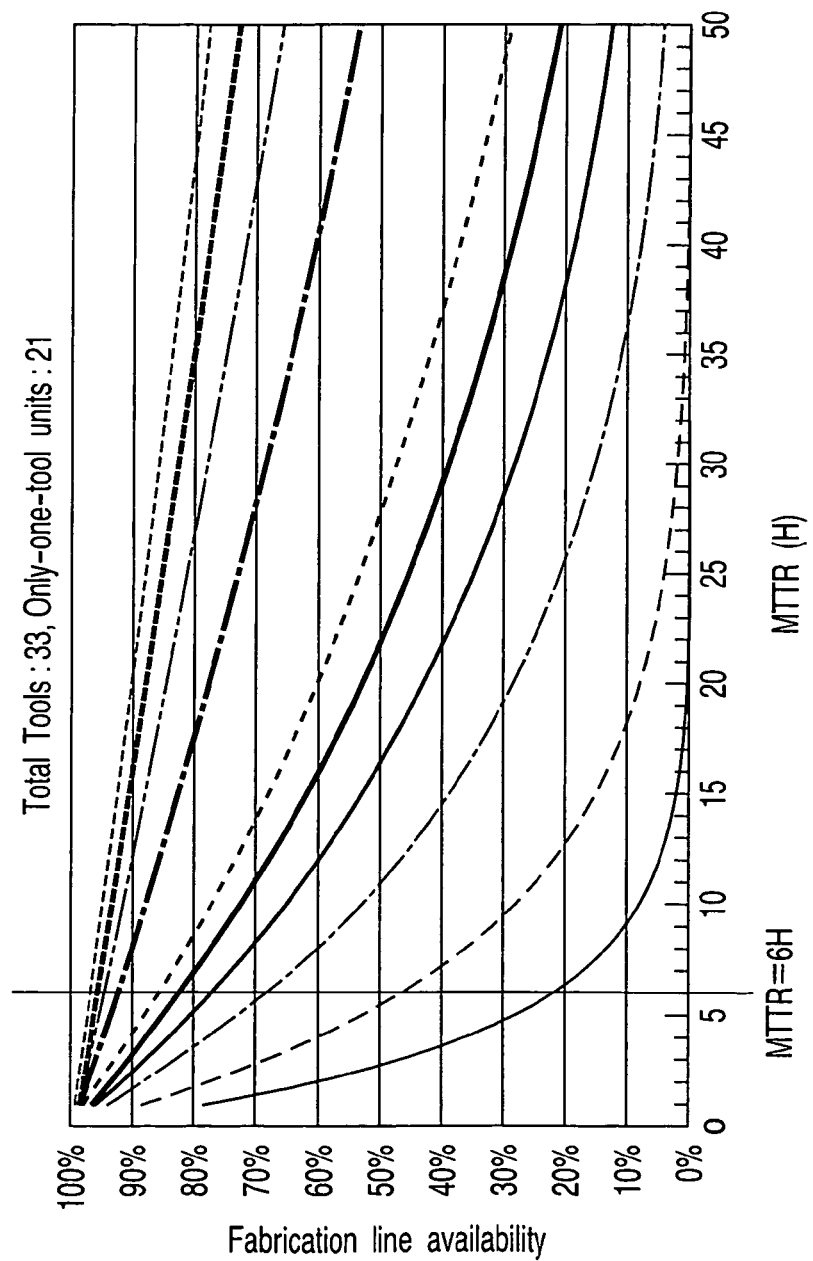
FIGS. 20A and 20B are views each showing a result obtained by making a calculation of an availability of the manufacturing line in the tool configuration of FIG. 19.

FIG. 20A shows a result of calculating the line availability in the case of the tool configuration of FIG. 19 in accordance with the method described previously. As is the case with the dedicated tool described previously in FIG. 2, in the case where MTTR= 6 H, the MTBF of 670 H is obtained when the line availability becomes 80%. As shown in FIG. 20A, the 670 H is obtained between 800 H in thick line and 600 H in thin line. This value is substantially equal to an average of the conventional MTBF values. Even in the case of the conventional tools of MTBF and MTTR values, the number of the one-tool units is reduced to about ½ in the case of FIG. 2, whereby the line availability increases and a practical line can be provided.

Further, through future development, it is predicted to be possible to ensure reduction to the number of the tools of FIG. 21 by carrying out unification of WET tool types; strengthened cleaning of the diffusion (DIFF) tool; providing 2 chambers in the RTP tool with two transportation systems; providing one tool type of the RIE tool; and supplying a high current to an ion source of the ion implantation tool.

Figures 22A, 22B:
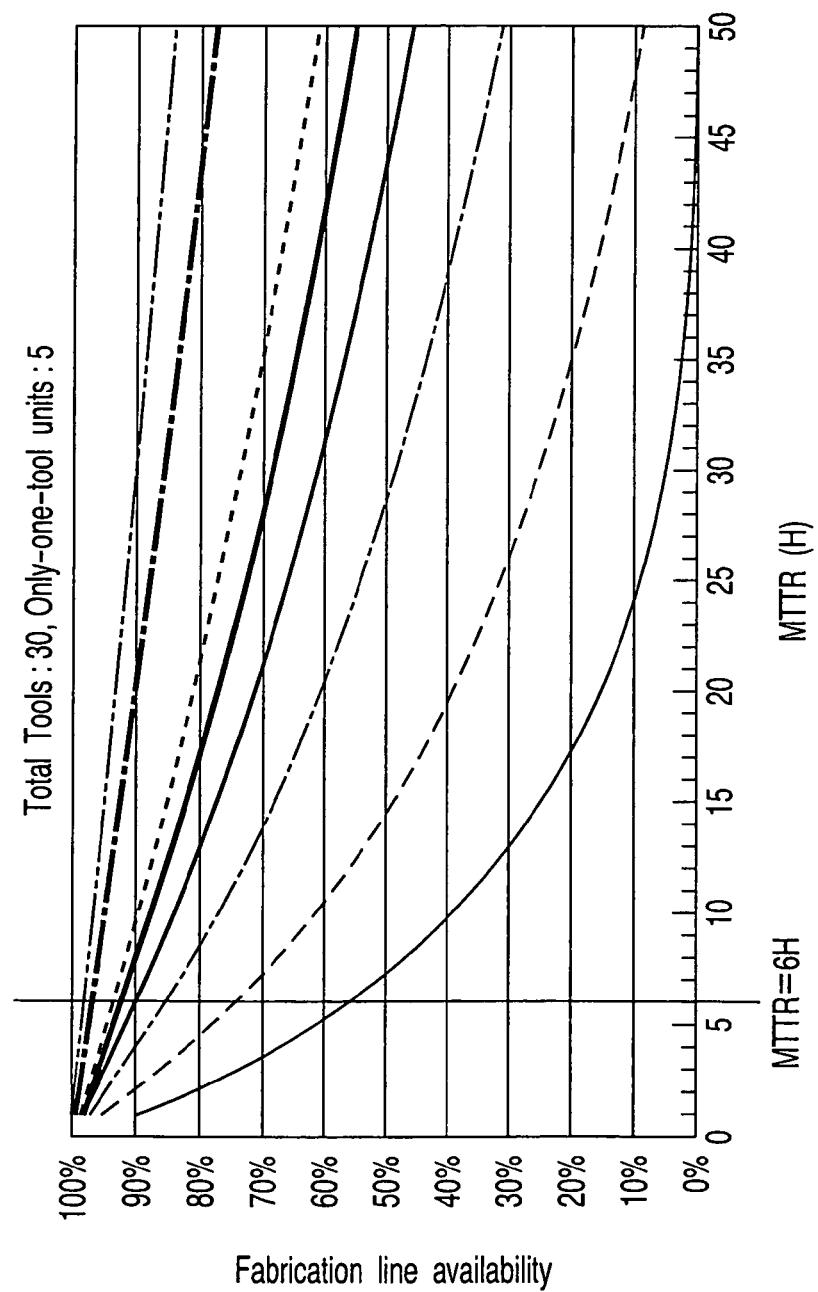
FIGS. 22A and 22B are views each showing a calculation result of a line availability of the tool configuration shown in FIG. 21.

In this case of FIG. 21, it is predicted that 5 one-tool units are provided, and the line availability will be increased. FIGS. 22A and 22B each show a result of actual calculation in the tool configuration of FIG. 21. In the case where MTTR=6 H and the line availability is 80%, the MTBF becomes 274 H. From this result, it is possible to predict that the line availability of 80% can be sufficiently achieved even by using the conventional tool units. In addition, even if the line availability is 90%, the MTBF is 600 H. Therefore, it is predicted that the line availability can be 90% or more even with respect to the reliability of the conventional tool units.

Figure 23:
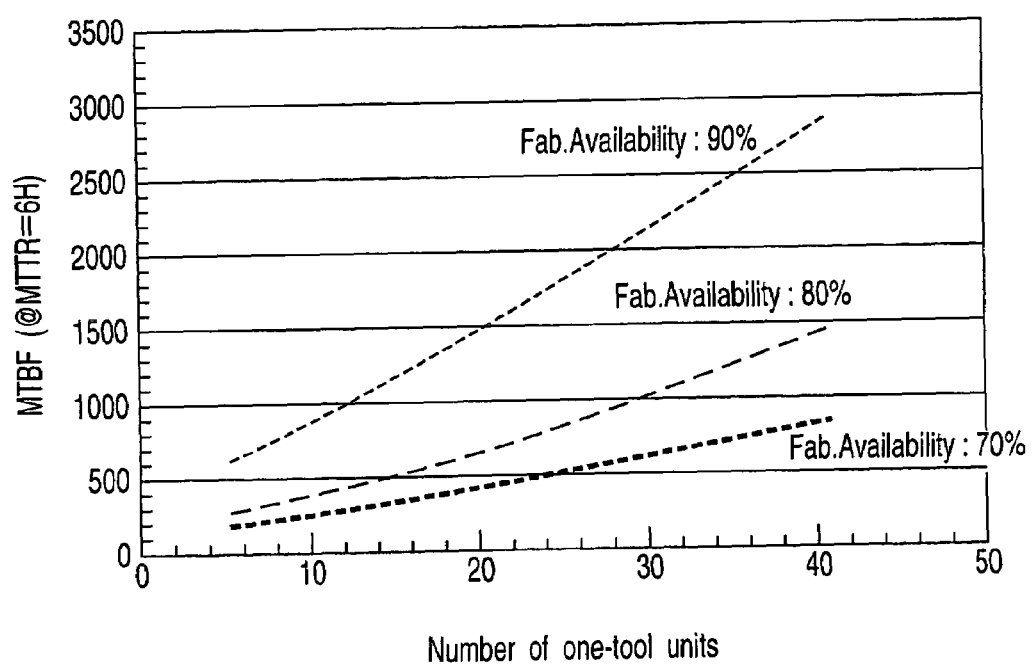
FIG. 23 is a view showing a relationship between an MTBF and an only one-tool unit number) required to obtain line availabilities of 70%, 80%, and 90% in the case where the MTTR is 6 H.

FIG. 23 shows a relationship between the number of one-tool units, the MTBF, and the line availability (Fab. availability) with respect to the above 3 cases. As is evident from the figure, it is found that the MTBF is proportional to the number of one-tool units, and the required MTBF increases with an increase of the line availability.

Therefore, it becomes clear what a tool configuration in a small sized line of about 100 Lots per month should be in consideration of the conventional tool reliability. In addition, designing of a clean room for installing tools or planning of required personnel or the like can be made with the tool configuration being determined, making it easy to reduce an amount of investment or determining a plan.

In the case of utilizing a shared technique, for example, in the case where two types of processing can be carried out by using one tool, this tool is used twice during such processing. However, with respect to such a tool, the number of tools is handled as one, only one calculation is made when calculating a product Πp of a probability of an availability of the fabrication tool. That is, a probability of generating a shared one tool as two or more tools is not calculated, and calculation is made based on an actual number of tools.

As has been described above, according to the present embodiment, in order to construct a semiconductor manufacturing line with high availability, the line availability is calculated in advance based on a model, and it is verified whether or not the planned units and tool configuration can achieve a target fabrication output. In this manner, optimization can be achieved by a loop for planning the units and tool configuration again. Moreover, the number of one-tool units can be reduced, and a total number of tools can also be reduced by sharing the tools. Thus, an increase of investment, an increase of running cost, and an increase of a clean room space do not occur. In particular, this advantage is effective for a small sized semiconductor manufacturing line having only one-tool unit for a processing event performed in the line.

(Second Embodiment)

In the first embodiment, the line availability has been obtained by checking all combinations of operation and stoppage of tools each configuring a line; incorporating the probabilities of operation and stoppage into the combinations; obtaining the incidence probability of each of the combinations; multiplying the production capabilities of that combination; and obtaining a sum of all the combinations. Although this method can obtain the line availability precisely, there is a problem that a large amount of time is required if a large number of cases exist in the case of obtaining all the combinations.

Figure 27:
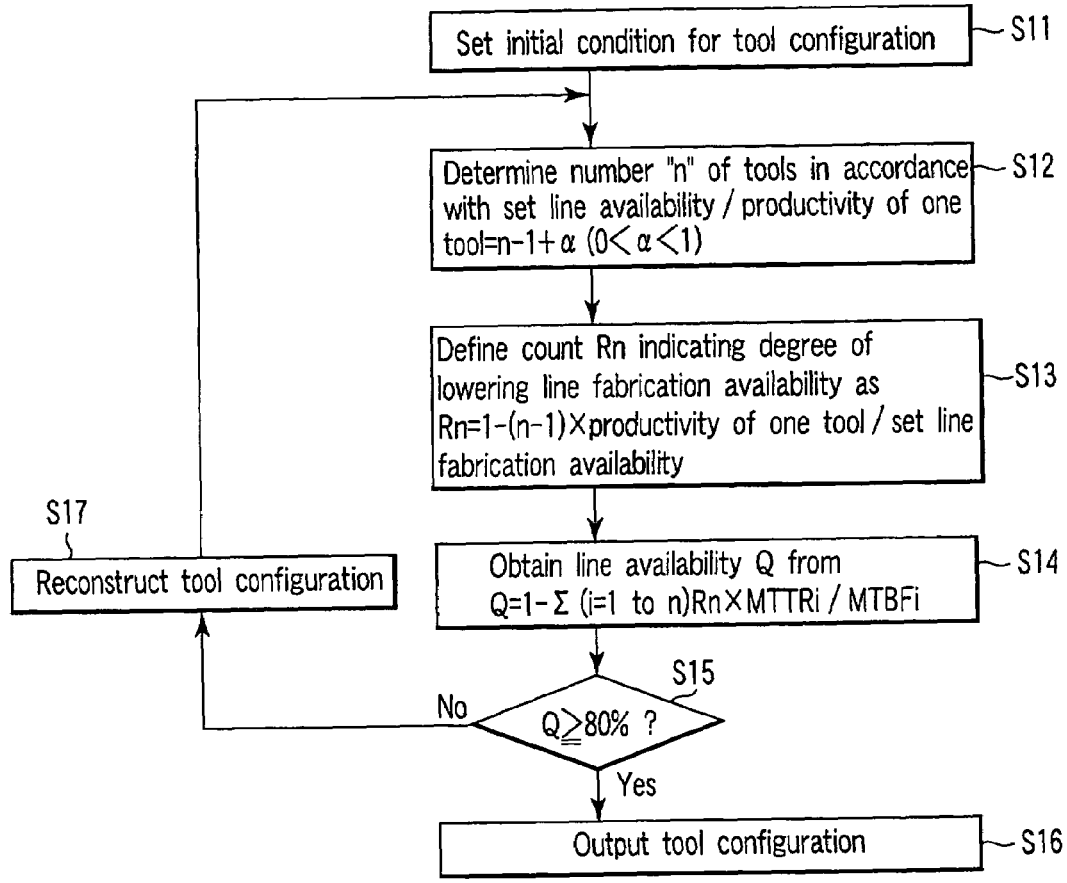
FIG. 27 is a flow chart illustrating an operation of a semiconductor manufacturing line design system according to a second embodiment of the present invention.

For example, several hundreds of tools are equipped in a line having a fabrication capability of 1000 Lots per month, and 10 or more tools are required for the same step. In this case, the number of combinations is deemed to be the second power of the number of tools. For example, if 300 tools exist in a line, combinations of $2^{300}$ can be assumed. It is substantially impossible to obtain a sum by multiplying the fabrication capability of each case in all of these cases. In the second embodiment, therefore, as shown in FIGS. 4A to 4C, assuming that the stoppage times of tools do not overlap each other, an average availability Q is obtained. Now, an operation of the second embodiment will be described here with reference to FIG. 27.

As is the case with the first embodiment shown in FIG. 5A, first, an initial condition is set for a tool configuration in a manufacturing line to be designed in step S11.

Next, in step S12, based on a numeric value obtained by rounding up a decimal portion of a quotient obtained by dividing the set line fabrication capability by the processing capability of one tool, a predetermined number "n" (n: number of tools) is determined in accordance with formula (4) below:

Set line fabrication capability/processing capability of one tool=$n-1+\alpha(0<\alpha<1)$ (4)

where $\alpha$ is a decimal portion of a quotient.

Then, the processing goes to step S13 in which a coefficient Rn indicating the degree of lowering the line fabrication availability is defined when one tool of an n-tool unit has stopped. This coefficient Rn is defined as follows.

$Rn=1-(n-1)\times$processing capability of one tool/set line fabrication capability (5)

In this case, when the $\alpha$ (a decimal portion of a quotient) is used, formula (5) is explained as follows.

$Rn=\alpha/(n-1+\alpha)$ (6)

In general, $\alpha$ becomes about 0.5 on average. The following calculation is made assuming that $\alpha=0.5$.

Next, using the above obtained value Rn, the line availability Q is calculated in step S14.

$Q=1-\Sigma_{(i=1 \text{ to } m)}Rn\times MTTRi/MTBFi$ (7)

In formula (7), calculation can be easily made even in the case where three or more units exist for one type of unit group. However, if there is established a state in which the stoppage times of tools overlap each other, namely, a state in which the average availability is lowe, the availability is lowered as compared with the case of the first embodiment in which all the cases have been calculated. This is because an operating time is reduced in the case where the stoppage times of tools have overlapped each other.

Figures 24A, 24B:
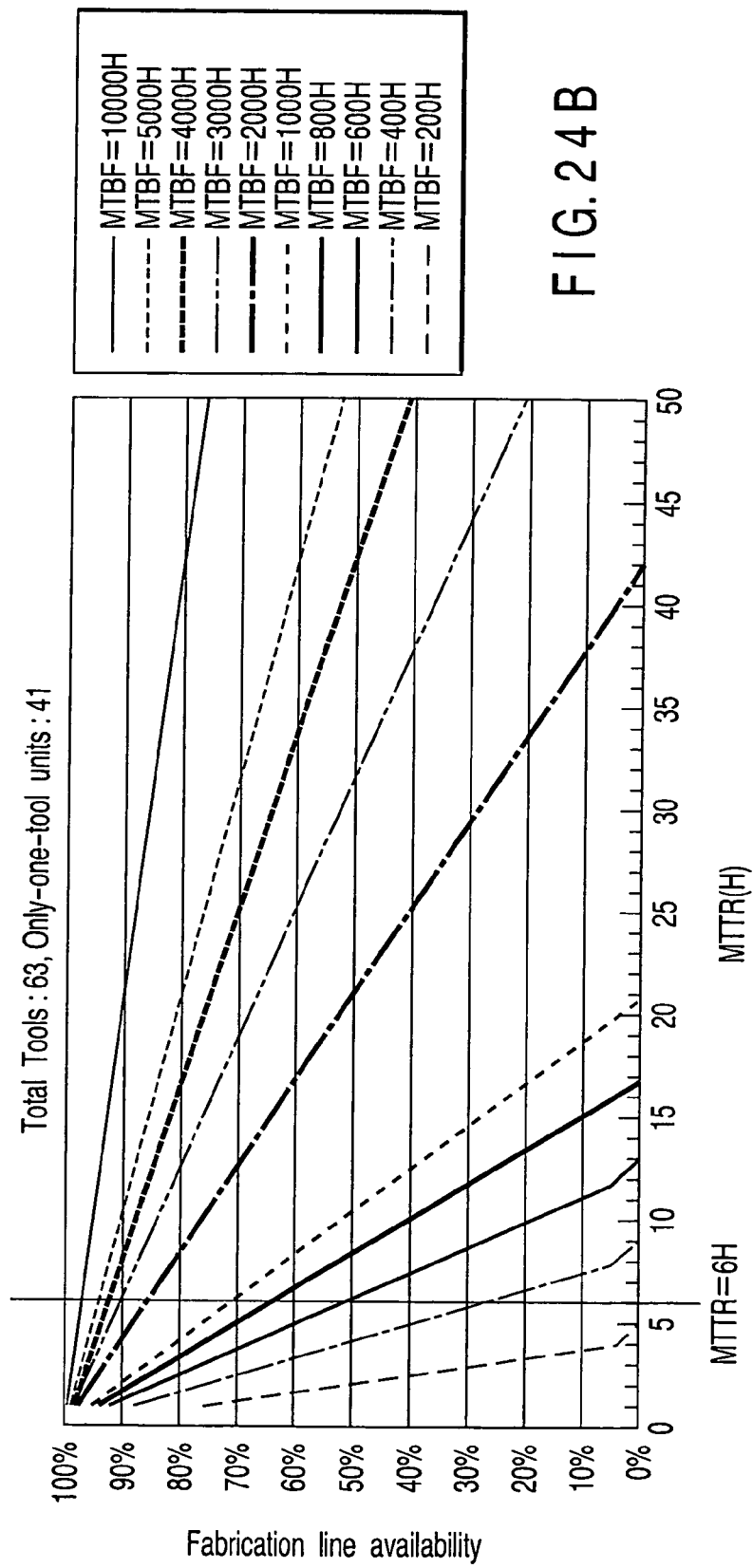
FIGS. 24A and 24B are views each showing a result of calculating a line availability of the tool configuration of FIG. 2 in accordance with a simplified calculation formula which assumes that no duplicate tool stoppage occurs.
Figures 25A, 25B:
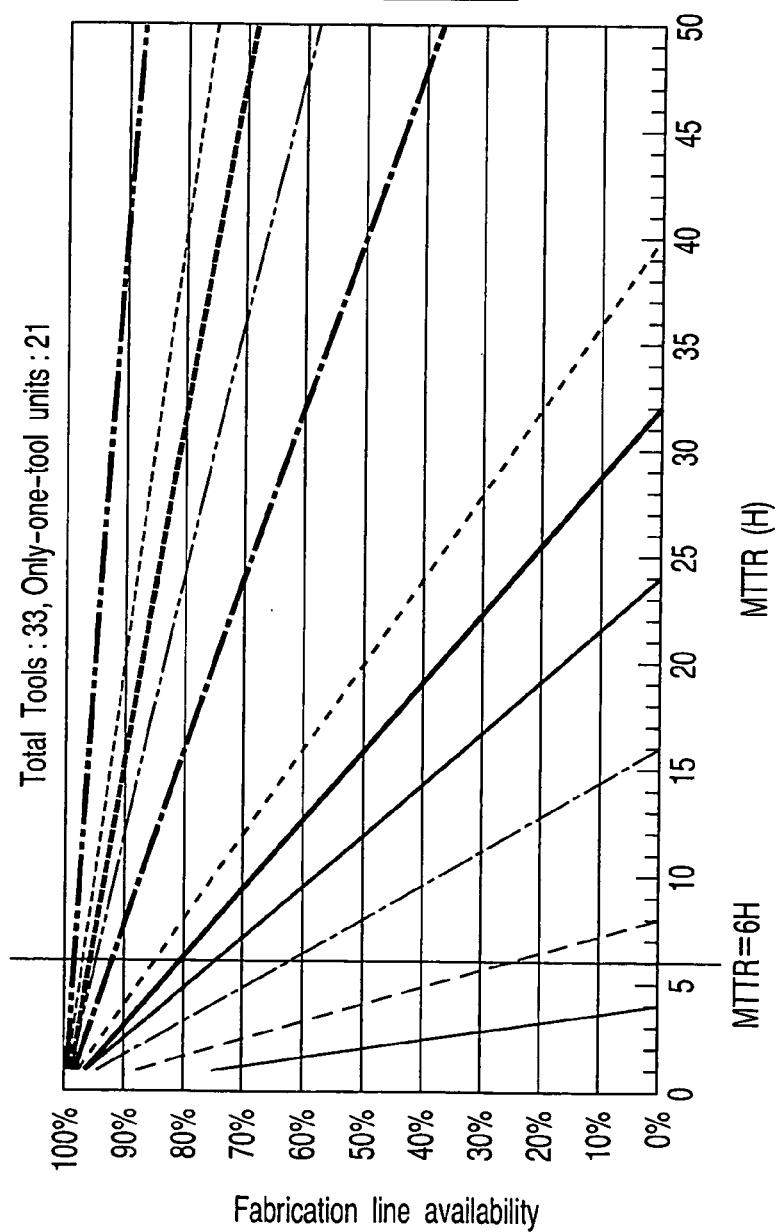
FIGS. 25A and 25B are views each showing a result of calculating a line availability of the tool configuration of FIG. 19 in accordance with a simplified calculation formula which assumes that no duplicate tool stoppage occurs.
Figures 26A, 26B:
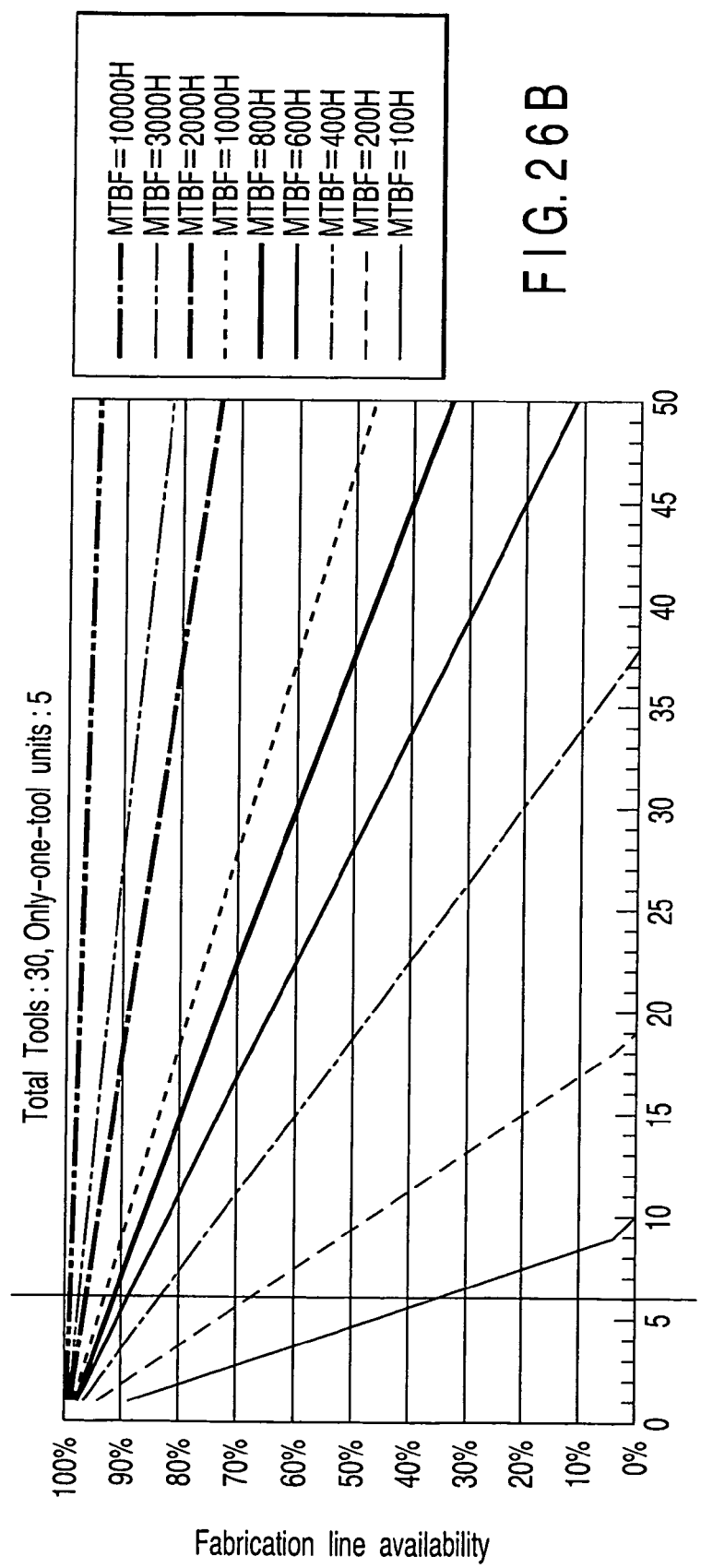
FIGS. 26A and 26B are views each showing a result of calculating a line availability of the tool configuration of FIG. 21 in accordance with a simplified calculation formula which assumes that no duplicate tool stoppage occurs.

FIGS. 24A, 24B, 25A, 25B, 26A and 26B each show a calculation result corresponding to each of the cases of the first embodiment. FIG. 24A shows a case in which total 63 tools are provided in the line, FIG. 25A shows total 33 tools case, and FIG. 26A total 30 tools case. As is evident from these figures, a difference is 2% or less when an average availability is 80% or more in any of the cases where a total number of tools is 63, 33, and 30, and the result almost coincides with strict calculation done in the case of the first embodiment. However, a difference becomes 4% or more when an average availability is 70% or less, and the reliability is lowered. However, in an ordinary case, it is necessary to increase the line availability to 80% or more. Only in this case, it is effective to make calculation in accordance with an approximation formula shown in the equation (7) described previously. Further, as described previously, if the number of tools increases, and in particular, if the number of three or more tool units increases in the case of one type of unit, it is actually impossible to make calculation unless this approximation formula is used.

In the next step S15, it is verified whether or not the Q value obtained in step S14 is 80% or more. When YES is obtained, processing goes to step S16 in which a designed tool configuration is outputted to, for example, the printer 3 or the external memory 4 shown in FIG. 5B.

When NO is obtained in step S15, as is the case with FIG. 5A, the tool configuration is reconstructed in accordance with step S17. Then, processing reverts to step S12 in which retry processing is carried out. The reconstruction used here, as is the case with the first embodiment, includes processing for adding a tool corresponding to that used in the one-tool unit group, thereby changing at least one one-tool unit to an n-tool unit (n≧2) in which two or more tool units have been allocated for the same processing event.

As a case in which a large number of tools exist, let us consider a conventional line for carrying out fabrication of 1000 L per month. In this case, as shown in FIG. 28, there are many types of tool units ranging from a one-tool unit to a 27-tool unit, and a total number of tools becomes 333. FIGS. 29A and 29B each show a result of making calculation of this case by using an approximation formula (7) described previously. In this case as well, when the line average availability is 80% or more, it is deemed that the approximate value is reliable. In actuality, the tool MTTR is about 6 H on average, and the MTBF is smaller than 800 H at the line availability of 80%. This MTBF value is almost equal to the MTBF in the conventional case, and thus, coincides with a result of the conventional fabrication line of 1000 L per month.

By making calculation using this approximation formula (7), it is possible to determine how many tools and what tool reliability (MTBF, MTTR) are required in order to increase an average availability of a target line.

As an actual example, FIGS. 30A and 30B show a result of calculating a relationship between the number of one-tool units (when only one tool is used for one type of unit) and the MTBF required to obtain a line availability of 80% or more in a line (mini-fabrication) whose scale is 100 L per month and a line (mega-fabrication) whose scale is 1000 L per month. From this result, in both of the cases of the scale of 100 L per month and 1000 L per month, it is found that an increased MTBF is required for tools in proportion to the number of one-tool units.

In addition, it is found that the scale of 1000 L per month requires an MTBF greater than that of 100 L per month. However, in a plotted range, 20 or less one-tool units exist in the scale of 1000 L per month, whereas 20 or more one-tool units exist in the scale of 100 per month in proportion. It is found that the MTBF obtained from FIG. 29A is equal to or greater than that in line whose scale is 100 L per month.

As has been described above, according to the present second embodiment, assuming that the stoppage times of tools each configuring a semiconductor manufacturing line do not overlap each other, the line availability Q is computed in accordance with formula (7) described previously, based on a total number "m" of tools, MTBF, MTTR, and a coefficient Rn indicating a degree of degrading the line fabrication availability when one tool of an n-tool unit has stopped. In this manner, even in a large scaled semiconductor manufacturing line, an availability of the semiconductor manufacturing line can be precisely evaluated by calculation processing in a sufficiently feasible range. In addition, it becomes possible to design a semiconductor manufacturing line with a high availability by reconstructing a tool configuration based on this evaluation.

(Third Embodiment)

The first embodiment has described as an example of reducing the number of one-tool units by sharing a processing tool among several steps and improving a line availability. A method of reducing the number of one-tool units includes introducing at least one tool of the same unit type to configure a two-tool unit and increase the line availability. In this manner, even if one tool in the two-tool unit stops, the other tool can continue processing step. In this method, there is a disadvantage that fabrication cost increases, although it is simple because the completely same tool is merely purchased. However, increasing the line availability is worthy because, the fabrication output increases concurrently and the term of work or the TAT is also reduced.

FIG. 31 shows a result of calculating the line availability when the same type of tool or tools have been redundantly introduced with respect to a line in which 21 one-tool units and 6 two-tool units exist. Calculation has been made from a case in which one tool of the same type as the group of 21 one-tool units is introduced. Namely, it is shown from a case in which one two-tool unit is increased and one one-tool unit is reduced (indicated by broken line 20-7 in the figure) to a case in which 6 tools are increased, namely, a case in which 6 two-tool units are increased and 6 one-tool units are reduced (indicated by thin line 15-12 in the FIG. 31).

That is, when another one-tool unit is introduced, one more two-tool unit is increased. In this case, such a two-tool unit has sufficient capability because, even if one of the two tools stops, the other one works. Thus, the line availability is not greatly affected or decreased. However, in the case where the two tools have stopped, the line availability is lowered. In consideration of this fact, as in the first embodiment, the probabilities are obtained with respect to the cases of combinations of operation and stoppage of all the tools; the line capability of these cases are multiplied with each other; and a sum of all the values is obtained, whereby it is found that the line availability is improved. FIG. 31 shows MTTR dependency of the line availability with respect to the case where MTBF=500 H. If one-tool units are decreased on a one by one basis, and then, two-tool units are increased on one by one basis, from a state in which there are 21 one-tool units and 6 two-tool units, it is found that the line availability is improved as the number of two-tool units is increased.

For example, referring to a point at which MTTR= 6 H in FIG. 31, in the case where there are 21 one-tool units, the line availability is 74%. However, when the number of one-tool units is reduced to 15, and then, the number of two-tool units is increased to 12, the line availability is improved to about 80%. Therefore, in order to achieve the target line availability, it is found how many tools corresponding to the one-tool unit group may be added. By using this technique, it becomes possible to easily determine what type of tool unit and how many tool units should be added, and an efficient line design can be made. That is, the availability can be improved while a number of added tools are suppressed to the minimum.

In addition, although there has been used the method of making calculation with respect to all the case described in the first embodiment, calculation can be made similarly even by using a simplified calculation technique described in the second embodiment. Although a tolerance increases unless this technique has been used under a condition in which the line availability is 80% or more, the above calculation technique is effective in particular in the case where a large amount of tools exist.

(Modification)

The present invention is not limited to each of the above-described embodiments. Examples of various processing tools or tools each configuring a semiconductor manufacturing line are not limited to those shown in the embodiments and can be applied to any unit used for fabrication of a semiconductor device. In addition, in a system configuration for carrying out the embodiments of the present invention, processing may be carried out by using a dedicated computer or a dedicated circuitry may be provided. Further, a program is provided for achieving the system configuration of the embodiments by using a computer, whereby the present invention may be carried out by a general-purpose computer. Furthermore, of course, a variety of methods other than those shown in the embodiments can be applied for share of a variety of units.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An availability evaluating system for obtaining an availability of a semiconductor manufacturing line in which it is virtually assumed that a unit group having one or more tool units are serially connected in time series according to a processing event, the system comprising:

a first unit configured to calculate an incidence probability $X_i$ (i=1 to k) in combination by applying a probability of tool operation and a probability of tool stoppage to all combinations "k" in which at least a line fabrication availability is not zero, of the combinations of operation and stoppage of tools each configuring the semiconductor manufacturing line and by obtaining a product of the probabilities of all the tools; and a second unit configured to, when a product between an incidence probability $X_i$ of a combination and a fabrication availability $Y_i$ of the combination is defined as a probability converted fabrication availability with respect to each of the combinations, calculate as a line availability a value of $Q=\Sigma_{(i=1 \; to \; k)} X1 \times Y1/F$ obtained by dividing a sum of probability converted fabrication availabilities of the combinations by a fabrication availability F determined during a 100% availability.

2. An availability evaluating system in a semiconductor manufacturing line according to claim 1, wherein, with respect to a plurality of tool unit groups having a plurality of tool units with respect to a same processing event, a sum of fabrication availabilities of an operating tool is defined as a fabrication availability of the unit groups, and a fabrication availability which is the lowest from among all the unit groups is defined as a fabrication availability of the combination.

3. An availability evaluating system for obtaining an availability of a semiconductor manufacturing line in which it is virtually assumed that a unit group having one or more tool units are serially connected in time series according to a processing event, the system comprising:

means for calculating an incidence probability Xi (i=1 to k) in combination by applying a probability of operation and a probability of stoppage to all combinations "k" in which at least a line fabrication availability is not zero, of the combinations of operation and stoppage of tools each configuring the semiconductor manufacturing line and by obtaining a product of the probabilities of all the tools; and means for, when a product between an incidence probability Xi of a combination and a fabrication availability Yi of the combination is defined as a probability converted fabrication availability with respect to each of the combinations, calculating as a line availability a value of $Q=\Sigma_{(i=1\ to\ k)} X1 \times Y1/F$ obtained by dividing a sum of probability converted fabrication availability of the combinations by a fabrication output F determined during a 100% availability.

4. A semiconductor manufacturing line design system for designing a semiconductor manufacturing line of a unit configuration in which it is virtually assumed that a unit group having one or more tool units are serially connected in time series according to a processing event, the system comprising:

a first unit configured to calculate an incidence probability Xi (i=1 to k) in combination by applying a probability of operation and a probability of stoppage to all combinations "k" in which at least a line fabrication availability is not zero, of the combinations of operation and stoppage of tools each configuring the semiconductor manufacturing line and by obtaining a product of the probabilities of all the tools;

a second unit configured to, when a product between an incidence probability Xi of a combination and a fabrication availability Yi of the combination is defined as a probability converted fabrication availability with respect to each of the combinations, calculate as a line availability a value of $Q=\Sigma_{(i=1\ to\ k)} X1 \times Y1/F$ obtained by dividing a sum of probability converted fabrication availabilities of the combinations by a fabrication availability F determined during a 100% availability;

a third unit configured to, when the line availability Q is less than 80%, reconstructing the unit configuration and repeating the calculation by the first and second units; and a fourth unit configured to, when the line availability Q is 80% or more, outputting the unit configuration as a proper system configuration.

5. A semiconductor manufacturing line design system according to claim 4, wherein, with respect to a plurality of tool unit groups having a plurality of tool units with respect to a same processing event, a sum of fabrication availabilities of an operating tool is defined as a fabrication availability of the unit groups, and a fabrication availability which is the lowest from among all the unit groups is defined as a fabrication availability of the combination.

6. An availability evaluating system for obtaining an availability of a semiconductor manufacturing line in which it is virtually assumed that a unit group having one or more tool units are serially connected in time series according to a processing event, the system comprising a calculation unit configured to calculate a line availability Q as $Q=1-\Sigma_{(i=1\ to\ m)} Rn \times MTTRi/MTBFi$, by defining a total number of tools each configuring the semiconductor manufacturing line as "m", a time between failures of tools as MTBF, a stoppage time caused by a failure as MTTR, and by assuming that the stoppage times of the tools do not overlap each other to define a coefficient indicating a degree of lowering Rn as a fabrication availability of a line when one tool of an n-tool unit group has stopped.

7. A semiconductor manufacturing line design system for designing a semiconductor manufacturing line of an tool configuration in which it is virtually assumed that a unit group having one or more tool units are serially connected in time series according to a processing event, the system comprising:

a first unit configured to define a total number of tool units each configuring the semiconductor manufacturing line as "m"; define a time between failures of units as MTBF and a stoppage time caused by a failure as MTTR; assume that the stoppage times of the tools do not overlap each other, define a coefficient indicating a degree of lowering Rn as a fabrication availability of a line when one tool of an n-tool unit group has stopped; and calculate a line availability Q as $Q=1-\Sigma_{(i=1\ to\ m)} Rn \times MTTRi/MTBFi$;

a second unit configured to, when the line availability Q is less than 80%, reconstruct the unit configuration and repeat the calculation; and a third unit configured to, when the line availability Q is 80% or more, output the unit configuration as a proper system configuration.

8. A semiconductor manufacturing line design system according to claim 4, wherein the third unit of reconstructing the unit configuration is configured to add at least one tool to a one-tool unit allocated to a same processing event as the added tool, so as to change the one-tool unit to an n-tool (n≧2) unit in which 2 or more tools have been allocated to the same processing event.

9. A semiconductor manufacturing line design system according to claim 7, wherein the third unit of reconstructing the unit configuration is configured to add at least one tool to a one-tool unit allocated to a same processing event as the added tool, so as to change the one-tool unit to an n-tool (n≧2) unit in which 2 or more tools have been allocated to the same processing event.

10. A semiconductor manufacturing line design system according to claim 4, wherein the third unit of reconstructing the unit configuration is configured to change at least one of a plurality of one-tool units to a one-tool unit allocated to a different processing event, based on a common use technique in which a one-tool unit is commonly used for different processing events.

11. A semiconductor manufacturing line design system according to claim 7, wherein the third unit of reconstructing the unit configuration is configured to change at least one of a plurality of one-tool units to a one-tool unit allocated to a different processing event, based on a common use technique in which a one-tool unit is commonly used for different processing events.

12. A semiconductor manufacturing line design system according to claim 10, wherein the unit configuration includes a tool provided with a wet cleaning tool including a fluid vessel for carrying out wet cleaning of a semiconductor device while supplying a wet cleaning fluid to the wet cleaning tool in one processing step, the wet cleaning fluid being changed with another wet cleaning fluid in another processing step in order to share the fluid vessel among a plurality of tools.

13. A semiconductor manufacturing line design system according to claim 10, wherein a cleaning configuration for carrying out cleaning of an object adhered in a tool for each different processing event is provided in order to share the tool for at least any of an RIE tool, a CVD tool, and an oxidizing/diffusing tool among a plurality of tools.

14. A semiconductor manufacturing line design system according to claim 10, wherein a CMP tool is provided with a divided polishing pad and a vacuum suction device for mounting the divided polishing pad onto a turn table in order to share the CMP tool among a plurality of tools.

15. A semiconductor manufacturing line design system according to claim 10, wherein an ion implanting tool is provided with a stencil mask for carrying out ion implantation at a desired portion of an object to be ion implanted through the stencil mask in order to share the ion implanting tool among a plurality of tools.

16. An availability evaluating method for obtaining an availability of a semiconductor manufacturing line in which it is virtually assumed that a unit group having one or more tool units are serially connected in time series according to a processing event, the method comprising:

calculating an incidence probability $Xi$ ($i=1$ to $k$) in combination by applying a probability of tool operation and a probability of tool stoppage to all combinations "k" in which at least a line fabrication availability is not zero, of the combinations of operation and stoppage of tools each configuring the semiconductor manufacturing line and by obtaining a product of the probabilities of all the tools; and calculating, when a product between an incidence probability $Xi$ of a combination and a fabrication availability $Yi$ of the combination is defined as a probability converted fabrication availability with respect to each of the combinations, as a line availability a value of $Q=\Sigma_{(i=1\ to\ k)} X1 \times Y1/F$ obtained by dividing a sum of probability converted fabrication availabilities of the combinations by a fabrication availability F determined during a 100% availability.

17. A semiconductor manufacturing line designing method for designing a semiconductor manufacturing line of a unit configuration in which it is virtually assumed that a unit group having one or more tool units are serially connected in time series according to a processing event, the method comprising:

calculating an incidence probability $Xi$ ($i=1$ to $k$) in combination by applying a probability of operation and a probability of stoppage to all combinations "k" in which at least a line fabrication availability is not zero, of the combinations of operation and stoppage of tools each configuring the semiconductor manufacturing line and by obtaining a product of the probabilities of all the tools;

calculating, when a product between an incidence probability $Xi$ of a combination and a fabrication availability $Yi$ of the combination is defined as a probability converted fabrication availability with respect to each of the combinations, as a line availability a value of $Q=\Sigma_{(i=1\ to\ k)} X1 \times Y1/F$ obtained by dividing a sum of probability converted fabrication availabilities of the combinations by a fabrication availability F determined during a 100% availability;

reconstructing, when the line availability Q is less than 80%, the unit configuration by repeating the calculation operations; and outputting, when the line availability Q is 80% or more, the unit configuration as a proper system configuration.

18. A program to be executed by a computer for evaluating an availability of a semiconductor manufacturing line in which it is virtually assumed that a unit group having one or more tool units are serially connected in time series according to a processing event, the program comprising:

a procedure for calculating an incidence probability $Xi$ ($i=1$ to $k$) in combination by applying a probability of tool operation and a probability of tool stoppage to all combinations "k" in which at least a line fabrication availability is not zero, of the combinations of operation and stoppage of tools each configuring the semiconductor manufacturing line and by obtaining a product of the probabilities of all the tools; and a procedure for, when a product between an incidence probability $Xi$ of a combination and a fabrication availability $Yi$ of the combination is defined as a probability converted fabrication availability with respect to each of the combinations, calculating as a line availability a value of $Q=\Sigma_{(i=1\ to\ k)} X1 \times Y1/F$ obtained by dividing a sum of probability converted fabrication availabilities of the combinations by a fabrication availability F determined during a 100% availability.

19. A program to be executed by a computer for designing a semiconductor manufacturing line of a unit configuration in which it is virtually assumed that a unit group having one or more tool units are serially connected in time series according to a processing event, the program comprising:

a procedure for calculating an incidence probability $Xi$ ($i=1$ to $k$) in combination by applying a probability of operation and a probability of stoppage to all combinations "k" in which at least a line fabrication availability is not zero, of the combinations of operation and stoppage of tools each configuring the semiconductor manufacturing line and by obtaining a product of the probabilities of all the tools;

a procedure for calculating, when a product between an incidence probability $Xi$ of a combination and a fabrication availability $Yi$ of the combination is defined as a probability converted fabrication availability with respect to each of the combinations, as a line availability a value of $Q=\Sigma_{(i=1\ to\ k)} X1 \times Y1/F$ obtained by dividing a sum of probability converted fabrication availabilities of the combinations by a fabrication availability F determined during a 100% availability;

a procedure for reconstructing, when the line availability Q is less than 80%, the unit configuration by repeating the calculation operations; and a procedure for outputting, when the line availability Q is 80% or more, the unit configuration as a proper system configuration.

* * * * *